United States Patent
We et al.

(10) Patent No.: US 12,230,552 B2
(45) Date of Patent: Feb. 18, 2025

(54) RECESS STRUCTURE FOR PADLESS STACK VIA

(71) Applicant: QUALCOMM Incorporated, San Diego, CA (US)

(72) Inventors: Hong Bok We, San Diego, CA (US); Joan Rey Villarba Buot, Escondido, CA (US); Aniket Patil, San Diego, CA (US)

(73) Assignee: QUALCOMM INCORPORATED, San Diego, CA (US)

( * ) Notice: Subject to any disclaimer, the term of this patent is extended or adjusted under 35 U.S.C. 154(b) by 478 days.

(21) Appl. No.: 17/455,576

(22) Filed: Nov. 18, 2021

(65) Prior Publication Data
US 2023/0154829 A1    May 18, 2023

(51) Int. Cl.
*H01L 23/48* (2006.01)
*H01L 21/768* (2006.01)
*H01L 23/498* (2006.01)

(52) U.S. Cl.
CPC ...... *H01L 23/481* (2013.01); *H01L 21/76804* (2013.01); *H01L 21/76898* (2013.01)

(58) Field of Classification Search
CPC ............. H01L 23/481; H01L 21/76804; H01L 21/76898; H01L 21/4857; H01L 23/49822
See application file for complete search history.

(56) References Cited

U.S. PATENT DOCUMENTS

| | | | | |
|---|---|---|---|---|
| 9,536,785 | B2 * | 1/2017 | Lin | .................. H01L 23/481 |
| 2002/0092833 | A1 * | 7/2002 | Lipman | .............. B23K 26/0673 |
| | | | | 219/121.7 |
| 2010/0327449 | A1 | 12/2010 | Furusawa et al. | |
| 2014/0041923 | A1 * | 2/2014 | Hisada | ................... H05K 1/115 |
| | | | | 174/266 |
| 2015/0364420 | A1 | 12/2015 | Lin et al. | |
| 2016/0093532 | A1 * | 3/2016 | Lin | ................... H01L 21/76898 |
| | | | | 438/109 |
| 2017/0271266 | A1 | 9/2017 | Kim et al. | |
| 2020/0176464 | A1 | 6/2020 | Jang et al. | |
| 2021/0287994 | A1 | 9/2021 | Hsueh et al. | |

FOREIGN PATENT DOCUMENTS

WO      2005038904 A1    4/2005

OTHER PUBLICATIONS

International Search Report and Written Opinion—PCT/US2022/078641—ISA/EPO—Feb. 20, 2023.

* cited by examiner

*Primary Examiner* — Herve-Louis Y Assouman
(74) *Attorney, Agent, or Firm* — Muncy, Geissler, Olds & Lowe, P.C.

(57) ABSTRACT

Disclosed is a stack via structure in which a plurality of vias are stacked over each other. At least one via is a via that has a recess formed from a top surface thereof. Another via above the via is formed such that a bottom portion of the another via is in the recess of the via. In this way, no capture pad is needed between the via and the another via. Also, contact area between the via and the another via is enhanced.

30 Claims, 16 Drawing Sheets

Conventional Art

RECESS STRUCTURE FOR PADLESS STACK VIA

FIELD OF DISCLOSURE

This disclosure relates generally to semiconductor devices, and more specifically, but not exclusively, to recess structures for padless stack vias and stack layer structures and fabrication techniques thereof.

BACKGROUND

Integrated circuit technology has achieved great strides in advancing computing power through miniaturization of active and passive components. The package devices can be found in many electronic devices, including processors, servers, radio frequency (RF) integrated circuits, etc. Packaging technology becomes cost-effective in high pin count devices and/or high production volume components.

Stack via structure design rules specify large pads for safe landing. For stack via applications, larger landing pad (also referred to as capture pad) design rules apply for improvement in placement accuracy. Placement accuracy is directly related with via bottom stress and reliability problems. Further, stack via pad affects all layer via pad dimensions and design flexibility due to reduction in routing space.

Accordingly, there is a need for systems, apparatus, and methods that overcome the deficiencies of conventional stack via structures including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects and/or examples relating to the apparatus and methods disclosed herein in a simplified form to precede the detailed description presented below.

An exemplary stack via structure is disclosed. The stack via structure may comprise a capture pad. The stack via structure may also comprise a first via stacked over and electrically coupled with the capture pad. The stack via structure may further comprise a second via stacked over and electrically coupled with the first via. The stack via structure may yet comprise a cover pad stacked over and electrically coupled with the second via. A top width of the first via may be wider than a bottom width of the second via. A recess may be formed in the first via to partially extend into a top surface thereof. A bottom portion of the second via may be within the recess. The bottom portion of the second via may extend from a bottom surface thereof up to a height equal to a depth of the recess. The second via may be in contact with the first via within the recess.

An exemplary stack layer structure is disclosed. The stack layer structure may comprise a capture pad and an inner via formed in an inner dielectric layer. The inner via may be stacked over and electrically coupled with the capture pad. The stack layer structure may also comprise one or more intermediate vias formed in corresponding one or more intermediate dielectric layers stacked over the inner dielectric layer. The one or more intermediate vias may be stacked over and electrically coupled with the inner via. The stack layer structure may further comprise an outer via formed in an outer dielectric layer stacked over the one or more intermediate dielectric layers. The outer via may be stacked over and electrically coupled with the one or more intermediate vias. The stack layer structure may yet comprise a cover pad stacked over and electrically coupled with the outer via. The stack layer structure may comprise a first via and a second via stacked over the first via. The first via may be the inner via or one of the one or more intermediate vias. The second via may be another one of the one or more intermediate vias or the outer via. A top width of the first via may be wider than a bottom width of the second via. A recess may be formed in the first via to partially extend into a top surface thereof. A bottom portion of the second via may be within the recess. The bottom portion of the second via may extend from a bottom surface thereof up to a height equal to a depth of the recess. The second via may be in contact with the first via within the recess.

An exemplary method of fabricating a stack via structure is disclosed. The method may comprise forming a capture pad. The method may also comprise forming a first via stacked over and electrically coupled with the capture pad. The method may further comprise forming a second via stacked over and electrically coupled with the first via. The method may yet comprise forming a cover pad stacked over and electrically coupled with the second via. A top width of the first via may be wider than a bottom width of the second via. A recess may be formed in the first via to partially extend into a top surface thereof. A bottom portion of the second via may be within the recess. The bottom portion of the second via may extend from a bottom surface thereof up to a height equal to a depth of the recess. The second via may be in contact with the first via within the recess.

An exemplary method of fabricating a stack layer structure is disclosed. The method may comprise forming a capture pad and an inner via in an inner dielectric layer. The inner via may be stacked over and electrically coupled with the capture pad. The method may also comprise forming one or more intermediate vias in corresponding one or more intermediate dielectric layers stacked over the inner dielectric layer. The one or more intermediate vias may be stacked over and electrically coupled with the inner via. The method may further comprise forming an outer via in an outer dielectric layer stacked over the one or more intermediate dielectric layers. The outer via may be stacked over and electrically coupled with the one or more intermediate vias. The method may yet comprise forming a cover pad stacked over and electrically coupled with the outer via. The stack layer structure may comprise a first via and a second via stacked over the first via. The first via may be the inner via or one of the one or more intermediate vias. The second via may be another one of the one or more intermediate vias or the outer via. A top width of the first via may be wider than a bottom width of the second via. A recess may be formed in the first via to partially extend into a top surface thereof. A bottom portion of the second via may be within the recess. The bottom portion of the second via may extend from a bottom surface thereof up to a height equal to a depth of the recess. The second via may be in contact with the first via within the recess.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1A:
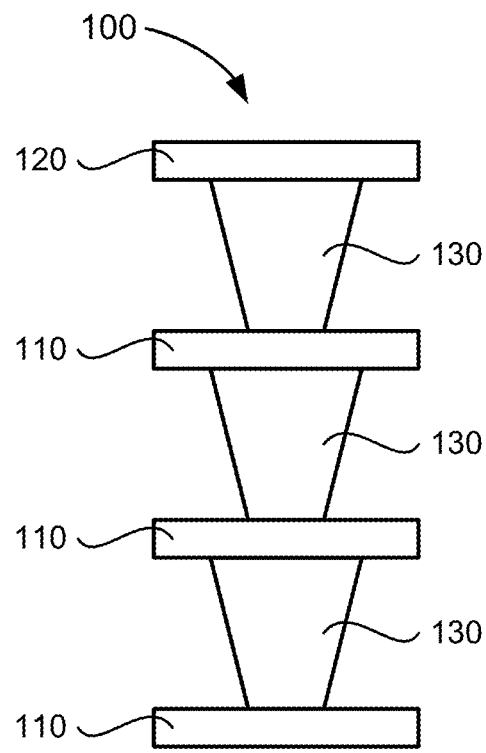
FIGS. 1A and 1B illustrate a sectional view and a top view of a layer of a conventional stack via structure.

Other objects and advantages associated with the aspects disclosed herein will be apparent to those skilled in the art based on the accompanying drawings and detailed description. In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary embodiments. In such instances, internal details of the known, conventional component structures and/or portions of operations may be omitted to help avoid potential obfuscation of the concepts illustrated in the illustrative embodiments disclosed herein.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

FIG. 1A illustrates a sectional view of a conventional stack via structure 100. As seen, the stack via structure 100 includes vias 130 vertically stacked on each other. Each via 130 is on and in contact with capture pad 110 (also referred to as landing pad). A cover pad 120 is on and in contact with the uppermost via 130. The stack via structure 100 uses the capture pads 110 and the cover pad 120 for top and bottom connection.

Figure 1B:
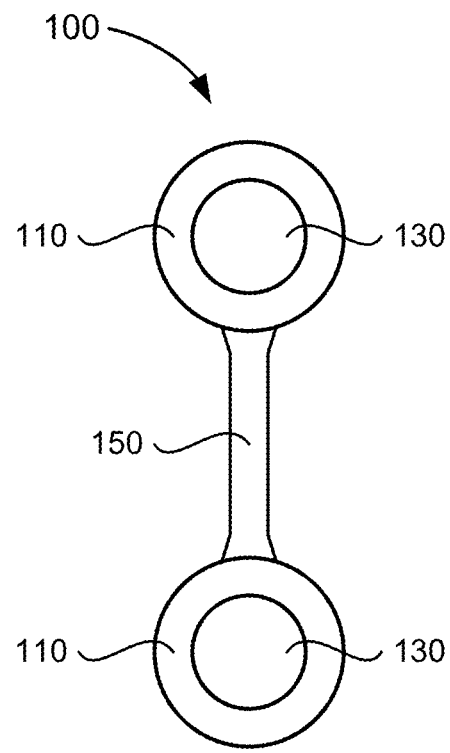

As indicated above, stack via structure design rules specify large pads for safe landing. For stack via applications, larger pad design rules apply for improvement in placement accuracy. In particular, the diameter of the capture pad 110 is larger than the diameter of the via 130. This is seen in FIG. 1B, which illustrates a top view of a layer of the conventional stack via structure 100. To provide a margin for placement accuracy, the diameter of the capture pad 110 is designed to be larger than the diameter of the via 130. A pattern line 150 may electrically couple two vias 130 with each other within the layer through the capture pad 110. Note that the larger diameter of the capture pad 110 reduces real estate available for routing of signals, which in turn means that design flexibility is reduced.

Figure 2A:
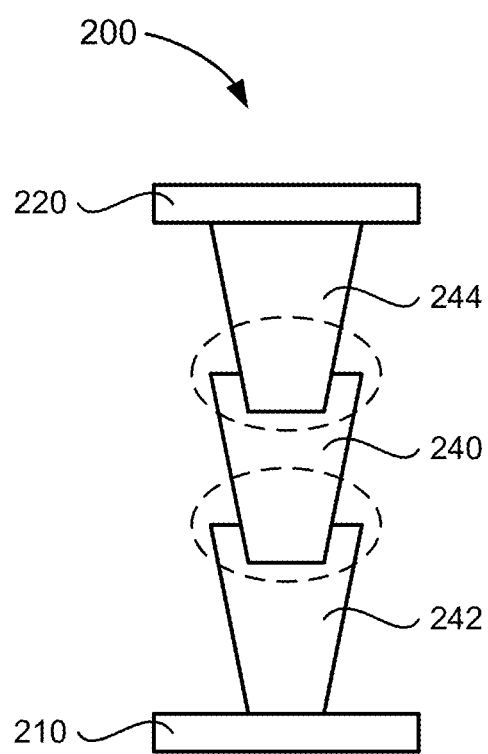
FIGS. 2A and 2B illustrate a sectional view and a top view of a layer of an example stack via structure in accordance with one or more aspects of the disclosure.

To address one or more issues of the conventional stack via structure, it is proposed to provide a stacked via structure in which the vias can be stacked directly on top of each other. In this way, the need for capture pads in between each pair of vias is eliminated. An example of a proposed stack via structure 200 is illustrated in FIG. 2A. The stack via structure 200 may comprise—from bottom to top—a capture pad 210, an inner via 242, an intermediate via 240, an outer via 244, and a cover pad 220. Before proceeding further, it should be noted that terms such as top, bottom, upper, lower, left, right, etc. are used for ease of description. Unless specifically stated otherwise, these terms should not be taken to mean absolute orientations. The stack of vias 240, 242, 244 and/or pads 210, 220 may be formed from conductive materials such as copper (Cu), aluminum (Al), etc.

The inner via 242 may be on and in contact with the capture pad 210, the intermediate via 240 may be on and in contact with the inner via 242, the outer via 244 may be on and in contact with the intermediate via 240, and the cover pad 220 may be on and in contact with the outer via 244. In this way, the capture pad 210 may be electrically coupled to the cover pad 220 through the inner via 242, the intermediate via 240, and the outer via 244, in that order.

Note that between any two immediately adjacent vias, there is a recess structure—highlighted by dashed ovals—for stacking of the adjacent vias. In particular, a bottom portion of an upper via (e.g., the outer via 244 or the intermediate via 240) may be inserted within a recess formed in a lower via (e.g., the inner via 242 or the intermediate via 240).

Figure 2B:
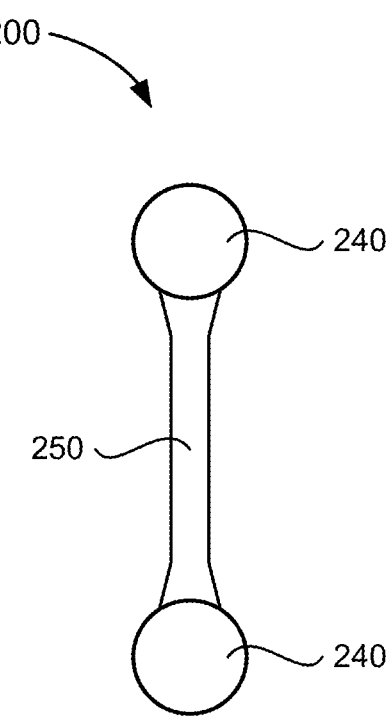

Note also that there are no landing pad between the upper and lower vias. This means that there can be additional space for routing. This is seen in FIG. 2B, which illustrates a top view of a layer of the stack via structure 200. Here, a pattern line 250 may electrically couple two vias 240 with each other within the layer. But unlike the situation illustrated in FIG. 1B, there are no pads in the layer of the stack via structure 200. Thus, the pattern line 250 may contact the intermediate vias 240 directly. As a result, design flexibility may be enhanced by increasing area available for routing of signals.

The following should be noted. While only one intermediate via 240 is shown in the stack via structure 200 of FIG. 2A, there can actually be any number of intermediate vias 240 between the inner via 242 and the outer via 244. Then the capture pad 210 may be electrically coupled to the cover pad 220 through the inner via 242, the one or more intermediate vias 240, and the outer via 244, in that order.

Figure 3:
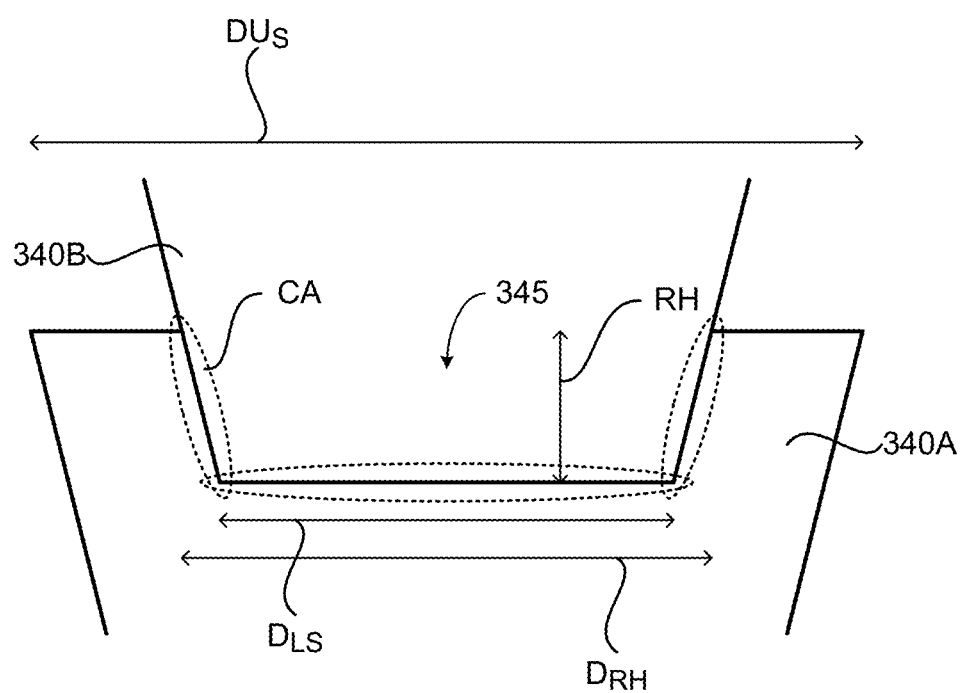
FIG. 3 illustrates a detailed view of an example via structure in accordance with one or more aspects of the disclosure.

A more detailed view of the recess structure highlighted as ovals in FIG. 2A is illustrated in FIG. 3, which shows a first via 340A and a second via 340B formed on the first via 340A. The first via 340A may be any via of the stack via structure 200 other than the outer via 244. That is, the first via 340A may be the inner via 242 or one of the one or more intermediate vias 240. Then the first via 340A may be stacked over and electrically coupled with the capture pad 210. It should be noted that stacked "on" does not necessarily require that the first via 340A be in contact with the inner via 242, although that is one of the possibilities. For example, all of the one or more intermediate vias 240 may be stacked over the capture pad 210. However, only the inner via 242 may be in contact with the capture pad 210. More particularly, a top surface of the capture pad 210 may be in contact with a bottom surface of the inner via 242.

The second via 340B may be any via of the stack via structure 200 other than the inner via 242. That is, the second via 340B may be one of the one or more intermediate vias 240 or the outer via 244. Then the second via 340B may be stacked over and electrically coupled with the first via 340A. In this instance, since the first and second vias 340A, 340B are immediately adjacent vias, they may be in contact with each other.

In the context of FIG. 2A, the cover pad 220 may be stacked over and electrically coupled with the second via 340B. Again, stacked "on" does not necessarily mean contact although that is a possibility. If the second via 340B is the outer via 244, then the cover pad 220 may be on and in contact with the second via 340B. More specifically, a bottom surface of the cover pad 220 may be in contact with a top surface of the outer via 244. But if the second via 340B is any one of the one or more intermediate vias 240, there would not be contact between the cover pad 220 and the second via 340B.

In an aspect, the vias (e.g., the inner via 242, the one or more intermediate vias 240, the outer via 244) may be tapered so that their respective top widths are wider than their bottom widths. In FIG. 3, this implies that the first via 340A and/or the second via 340B may be tapered. When the first via 340A is tapered, a top width thereof may be wider than a bottom width thereof. For ease of reference, the top and bottom widths of the first via 340A may respectively be referred to as "first top width" and "first bottom width". Similarly, when the second via 340B is tapered, second top width (top width of the second via 340B) may be wider than second bottom width (bottom width of the second via 340B). Also, as seen in FIG. 3, the first top width may be wider than the second bottom width.

A recess 345 may be formed to partially extend into the first via 340A from a top surface thereof. That is, the first via 340A may comprise the recess 345 that partially extends into the first via 340A from the top surface thereof. A portion of the second via 340B extending from a bottom surface thereof up to a height equal to a depth of the recess 345 may be inserted within the recess 345. For ease of reference, this bottom portion of the second via 340B may be referred to as "second bottom portion". The depth of the recess 345 may nominally range between 5% and 15% of a total height of the first via 340A.

In an aspect, the second bottom portion may be in contact with the first via 340A within the recess 345 as highlighted by dotted ovals. Note that the recess 345 may be tapered such that a recess top width (top width of the recess 345) is wider than a recess bottom width (bottom width of the recess 345). The contact between the first and second vias 340A, 340B may be such that side surface of the second bottom portion is in contact with a side surface of the recess 345. Similarly, the second bottom surface, i.e., the bottom surface of the second bottom portion (which is also the bottom portion of the second via 340B) may be in contact with a bottom surface of the recess 345. As such, contact area may be increased, which in turn can enhance structural integrity. That is, the first and second vias 340A, 340B may be better anchored to each other.

In the context of FIG. 2A above, it is indicated that there are no landing pads between the upper and lower vias. In FIG. 3, this may translate to having no capture pad between the first and second vias 340A, 340B. Also, in the context of FIG. 2B, it is indicated that the pattern line 250 may contact two vias of the same layer. In FIG. 3, this may translate to a pattern line 250 being in contact with the first via 340A and a via (e.g., a via 240) on a same layer as the first via 340A. Alternatively or in addition thereto, another pattern line 250 may be in contact with the second via 340B and a same or different via (e.g., same or different via 240) on a same layer as the second via 340B. Further in the context of FIG. 2A, it is indicated that the capture pad 210 may be electrically coupled to the cover pad 220, the inner via 242, the one or more intermediate vias 240, and the outer via 244, in that order. In FIG. 3, this may be translated as the capture pad 210 being electrically coupled to the cover pad 220 through the first via 340A and the second via 340B in that order. It should be noted that of course there can be other vias (e.g., inner via 242, other intermediate vias 240, outer via 244) that may be in the electrical path between the capture and cover pads 210, 220.

Figure 4A:
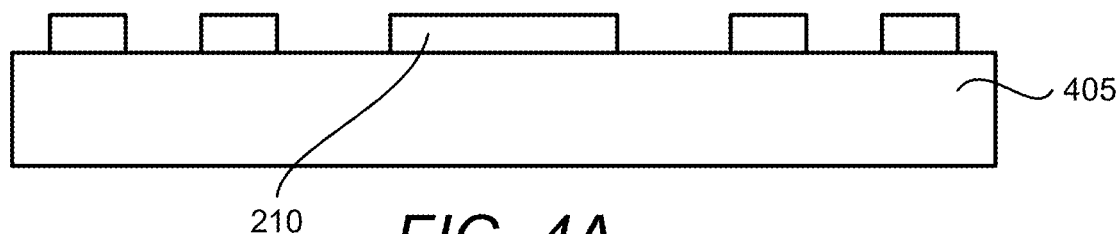
FIGS. 4A-4I illustrate examples of stages of fabricating a stack layer structure in accordance with one or more aspects of the disclosure.

The stack via structure 200 of FIGS. 2A, 2B and 3 may be used in stack layer structures. FIGS. 4A-4I illustrate examples of stages of fabricating a stack layer structure in accordance with one or more aspects of the disclosure. Before describing the stages, attention is brought to FIG. 4I illustrating an example stack layer structure 400 in which the stack via structure 200 may be incorporated. The stack layer structure 400 may be an example of a stack layer structure based on an embedded trace substrate (ETS).

As seen FIG. 4I, the stack layer structure 400 may comprise an initial layer 460, also referred to as base layer 460. A capture pad 210 and an inner via 242 may be formed in an inner dielectric layer 415, which may be stacked over the initial layer 460. The inner via 242 may be stacked over and electrically coupled with the capture pad 210.

The stack layer structure 400 may also comprise an intermediate via 240 formed in an intermediate dielectric layer 425, which may itself be stacked over the inner dielectric layer 415. Recall from above that the stack via structure may include any number of intermediate vias 240. Thus, while one intermediate dielectric layer 425 is shown in FIG. 4I, there can be any number of intermediate dielectric layers 425. That is, the stack layer structure 400 may comprise one or more intermediate vias 240 formed in corresponding one or more intermediate dielectric layers 425 which may be stacked over the inner dielectric layer 415. The one or more intermediate vias 240 may be stacked over and electrically coupled with the inner via 242.

The stack layer structure 400 may further comprise an outer via 244 formed in an outer dielectric layer 435, which may be stacked over the one or more intermediate dielectric layers 425. The outer via 244 may be stacked over and electrically coupled with the one or more intermediate vias 240.

The stack layer structure 400 may yet comprise a cover pad 220 stacked over and electrically coupled with the outer via 244. Note that the cover pad 220 may be formed in a cover layer 445, which may be the outermost layer of the stack layer structure 400. Also note that the cover pad 220 may be exposed. That is, the cover pad 220 may be configured to enable a signal connection between the stack layer structure 400 and a device external to the stack layer structure 400. For example, multiple cover pads 220 may serve as ball grid arrays (BGA).

In aspect, it may be said that the stack layer structure 400 comprises first vias 340A and a second via 340B as described with respect to FIG. 3. The second via 340B may be immediately stacked over the first via 340A. The first via 340A may be the inner via 242 or one of the one or more intermediate vias 240. The second via 340B may be one of the one or more intermediate vias 240 or the outer via 244. Details of the first and second vias 340A, 340B are provided above, and thus are not repeated here for sake of brevity.

Various stages of fabricating the stack layer structure 400 will now be described. FIG. 4A illustrates a stage in which the capture pad 210 may be formed on a carrier 405.

Figure 4B:
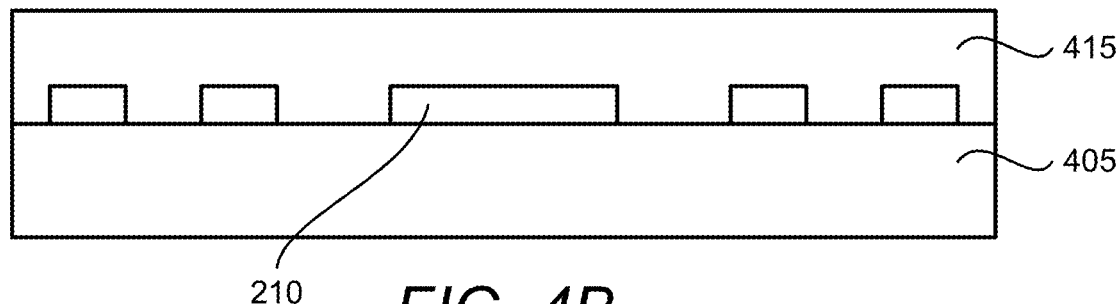

FIG. 4B illustrates a stage in which the inner dielectric layer 415 may be formed on the carrier 405 and covers the capture pad 210. For example, the inner dielectric layer 415 may be laminated on the carrier 405.

Figure 4C:
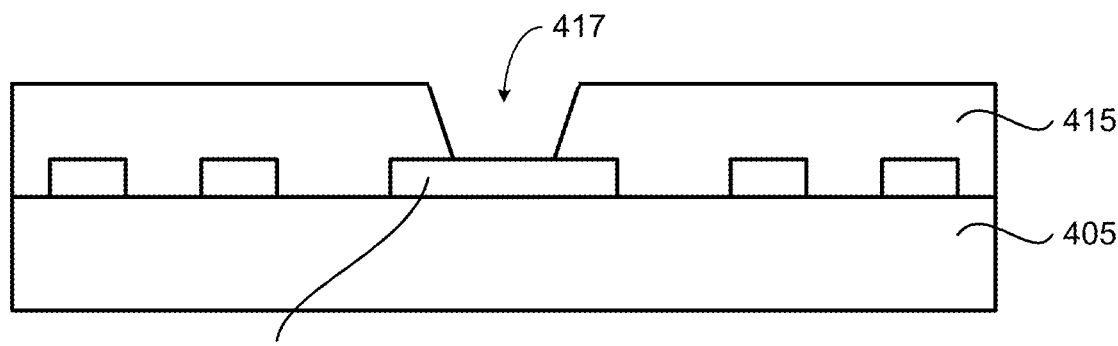

FIG. 4C illustrates a stage in which the inner dielectric layer 415 may be processed to form an inner via hole 417 to expose the capture pad 210. For example, the inner via hole 417 may be formed by laser drilling.

Figure 4D:
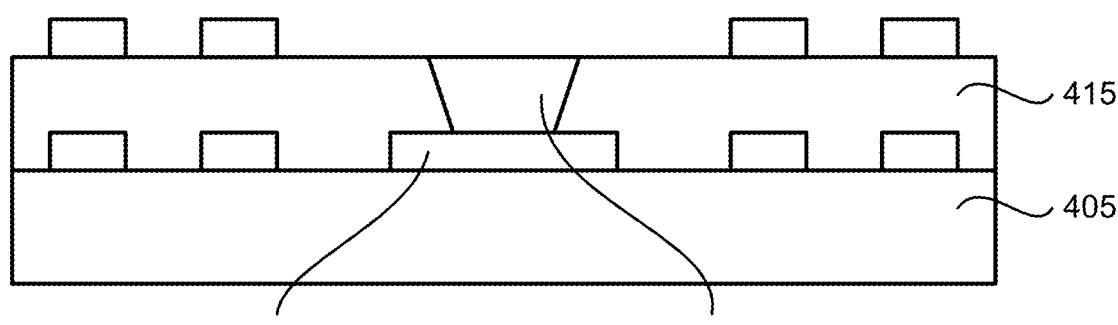

FIG. 4D illustrates a stage in which the inner dielectric layer 415 and the inner via hole 417 may be plated with conductive materials (e.g., Cu, Al, etc.) to form the inner via 242 to fill the inner via hole 417. At this stage, the recess is not yet formed in the inner via 242.

Figure 4E:
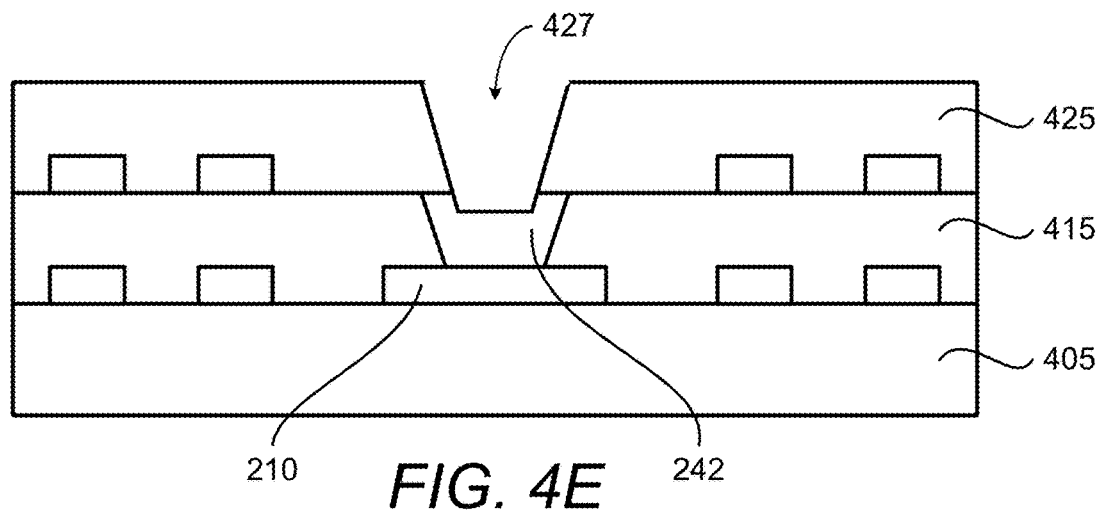

FIG. 4E illustrates a stage in which an intermediate via hole 427 may be formed in the intermediate dielectric layer 425. In an aspect, the intermediate dielectric layer 425 may be laminated on the inner dielectric layer 415. The intermediate dielectric layer 425 may then be drilled, e.g., through laser drilling, to expose the inner via 242. The drilling may also drill the recess in the inner via 242.

Figure 4F:
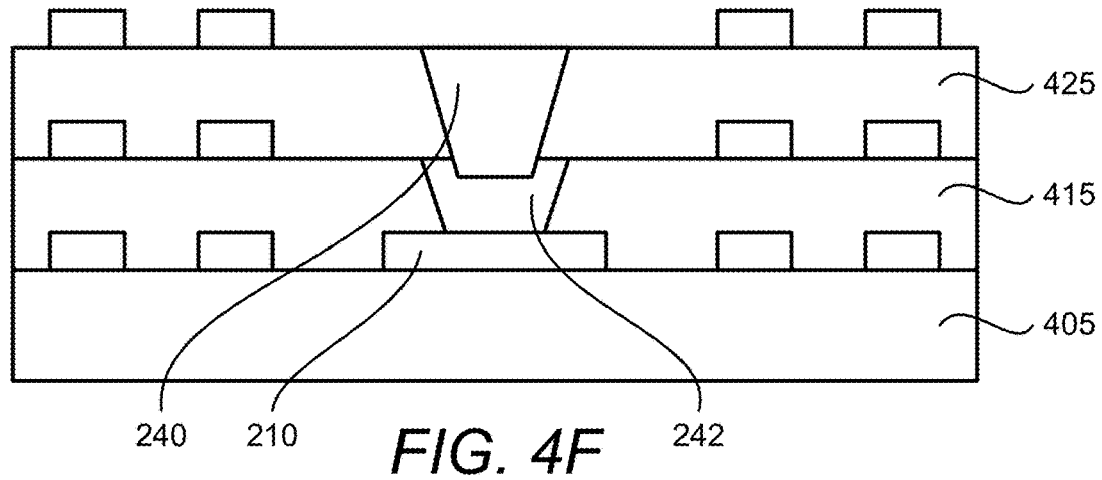

FIG. 4F illustrates a stage in which the intermediate dielectric layer 425 and the intermediate via hole 427 may be plated with conductive materials (e.g., Cu, Al, etc.) to form the intermediate via 240 to fill the intermediate via hole 427. The intermediate via 240 may also fill the recess of the inner via 242. At this stage, the recess is not yet formed in the intermediate via 240.

Figure 4G:
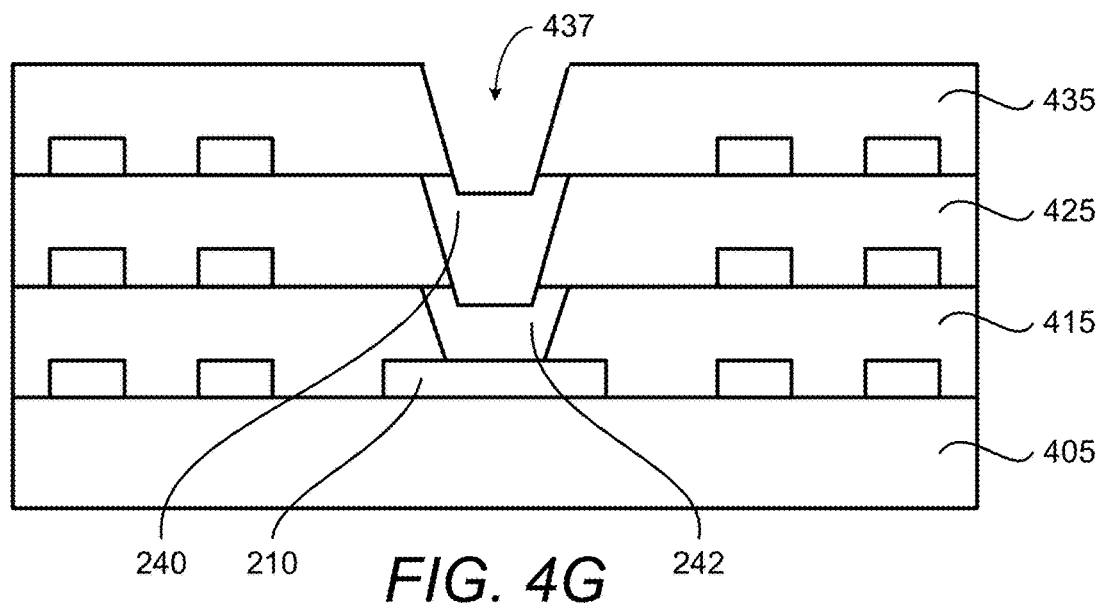

FIG. 4G illustrates a stage in which an outer via hole 437 may be formed in the outer dielectric layer 435. In an aspect, the outer dielectric layer 435 may be laminated on the intermediate dielectric layer 425. The outer dielectric layer 435 may then be drilled, e.g., through laser drilling, to expose intermediate via 240. The drilling may also drill the recess in the intermediate via 240.

Figure 4H:
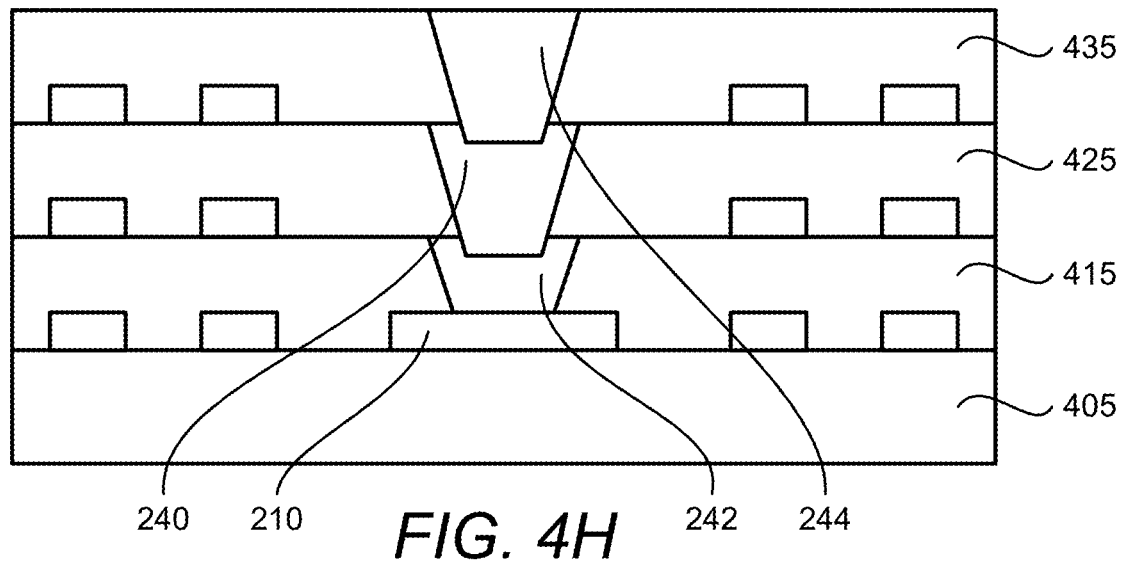
Figure 4I:
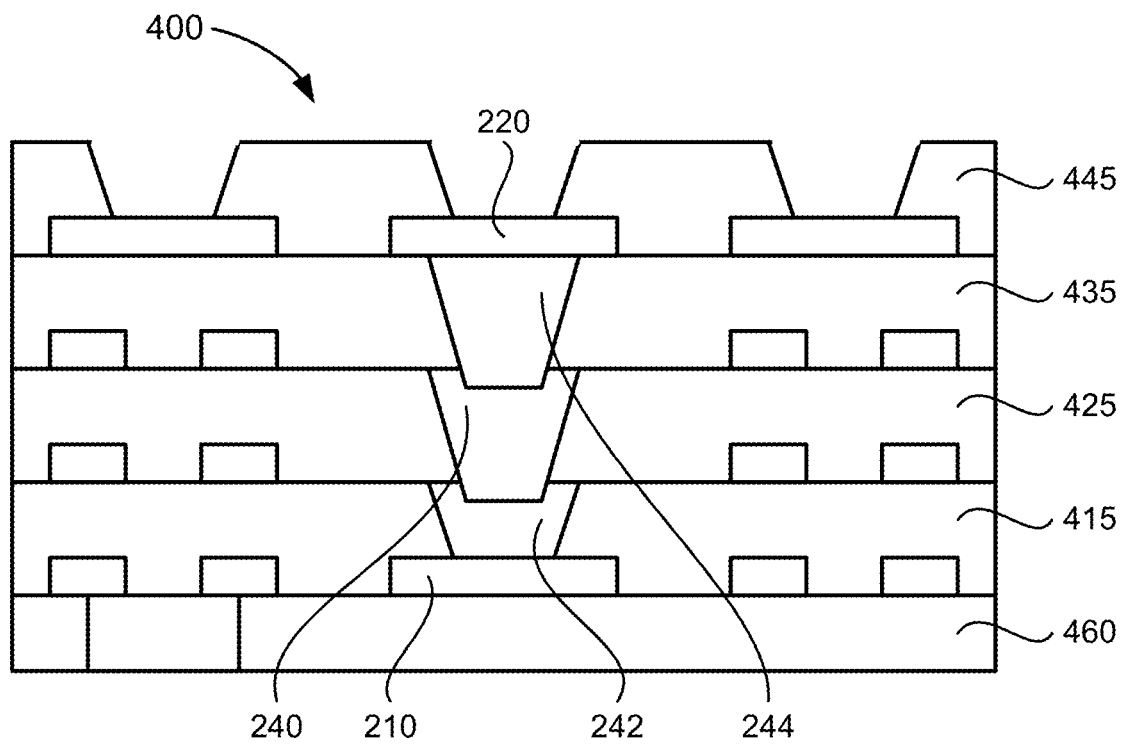

FIG. 4H illustrates a stage in which the outer dielectric layer 435 and the outer via hole 437 may be plated with conductive materials (e.g., Cu, Al, etc.) to form the outer via 244 to fill the outer via hole 437. The outer via 244 may also fill the recess of the intermediate via 240.

FIG. 4I illustrates a stage in which the carrier 405 may be removed and the initial layer 460 may be formed below the inner dielectric layer 415. Also, the cover pad 220 may be formed on the outer dielectric layer 435, the cover layer 445 may then be formed (e.g., laminated) on the outer dielectric layer 435 and the cover pad 220, which may then be processed to expose cover pad 220.

While not shown, it should be noted that by repeating the stages illustrated in FIGS. 4E and 4F, multiple intermediate dielectric layers 425 and corresponding multiple intermediate vias 240 may be fabricated.

Figure 5A:
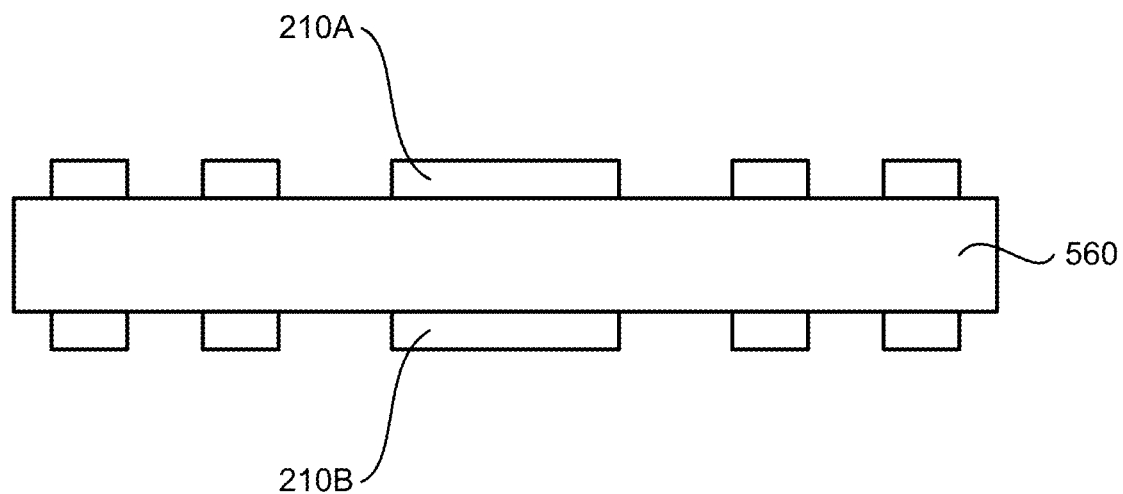
FIGS. 5A-5G illustrate examples of stages of fabricating another stack layer structure in accordance with one or more aspects of the disclosure.
Figure 5B:
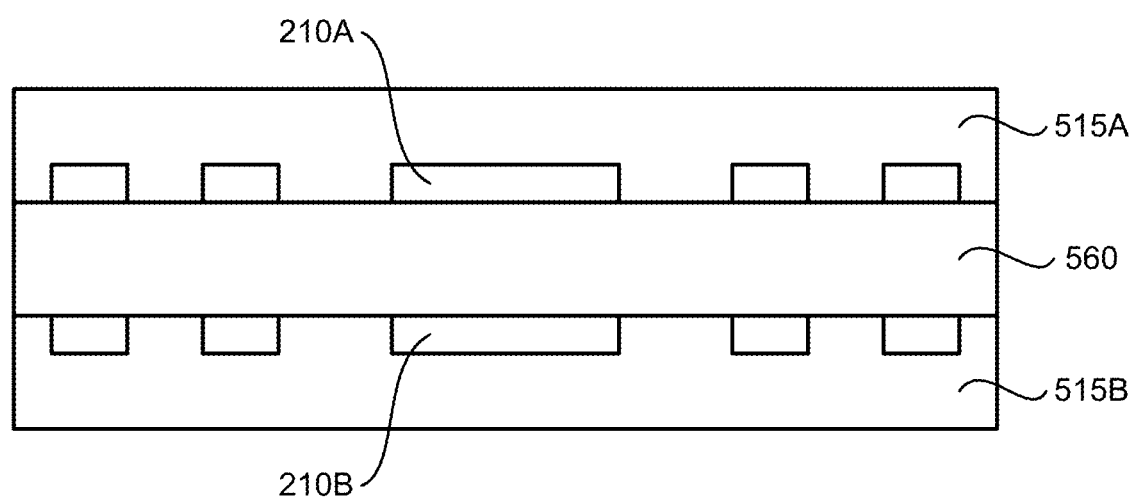
Figure 5C:
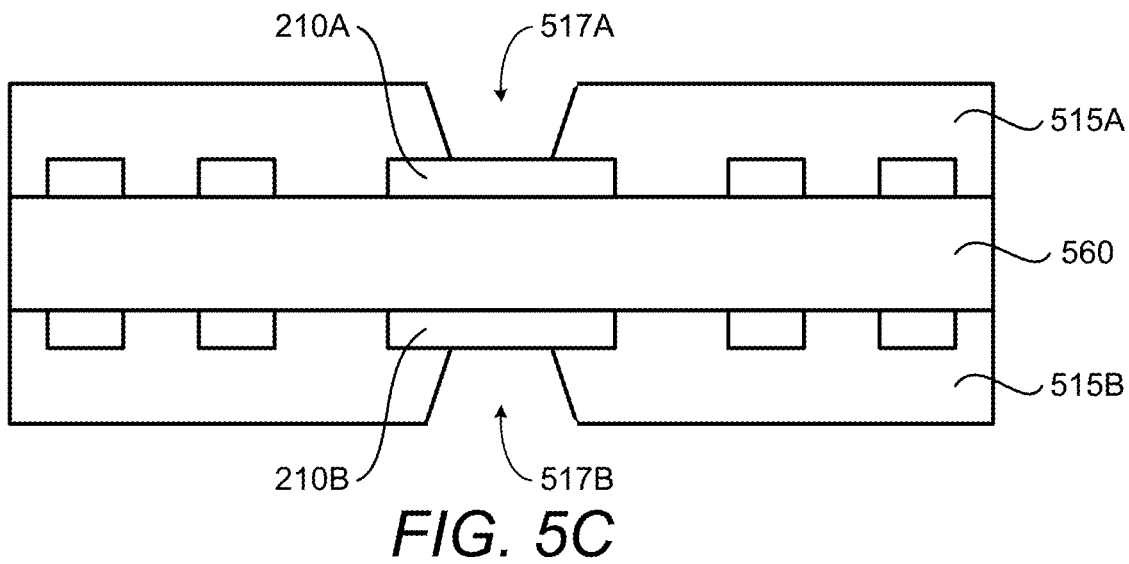
Figure 5D:
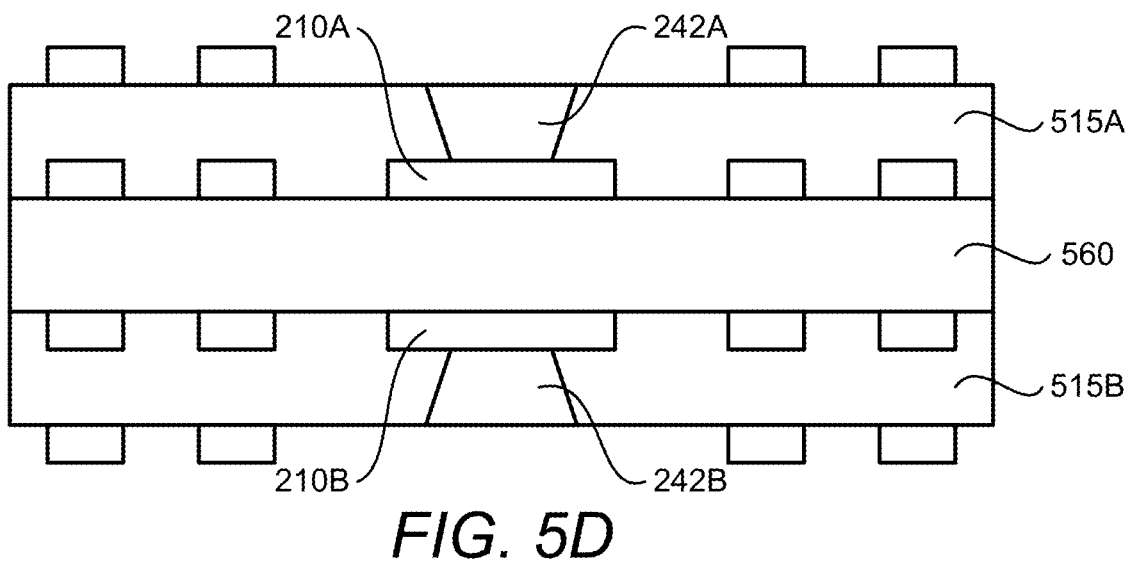
Figure 5E:
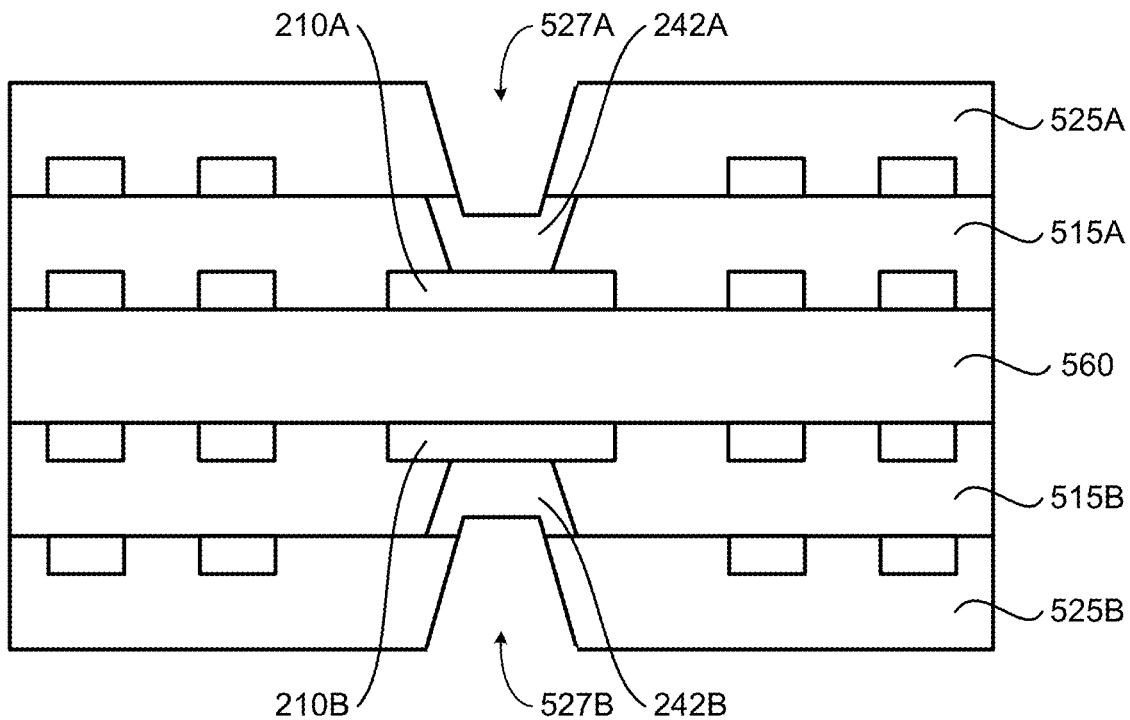
Figure 5F:
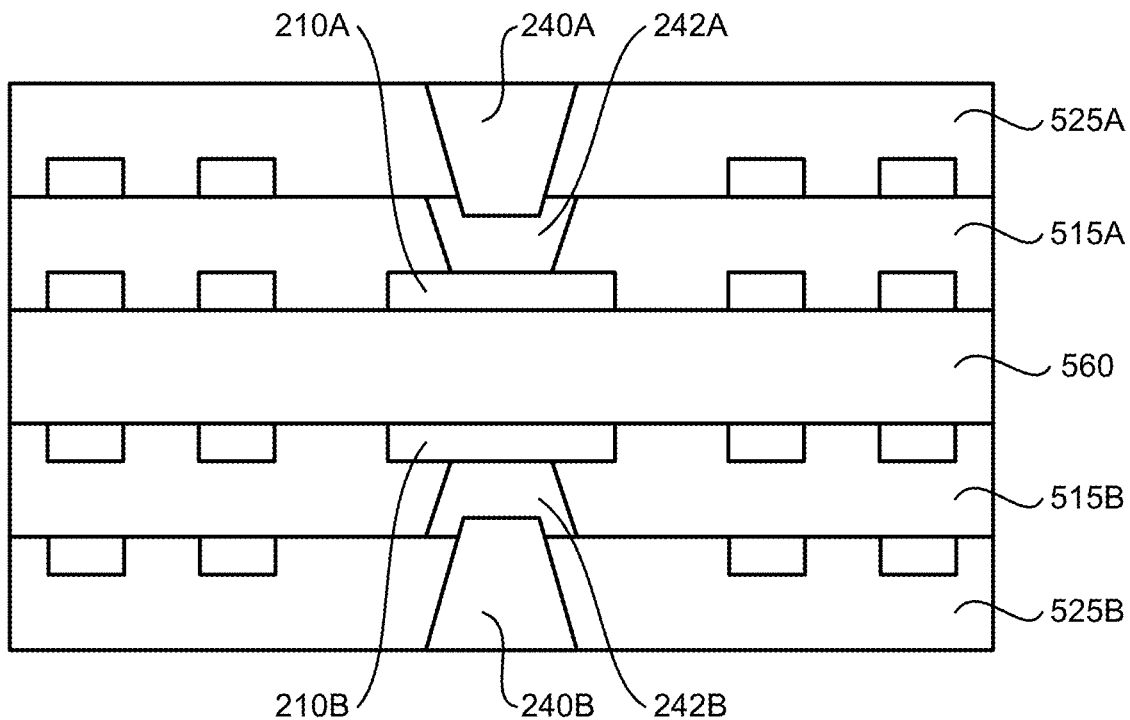
Figure 5G:
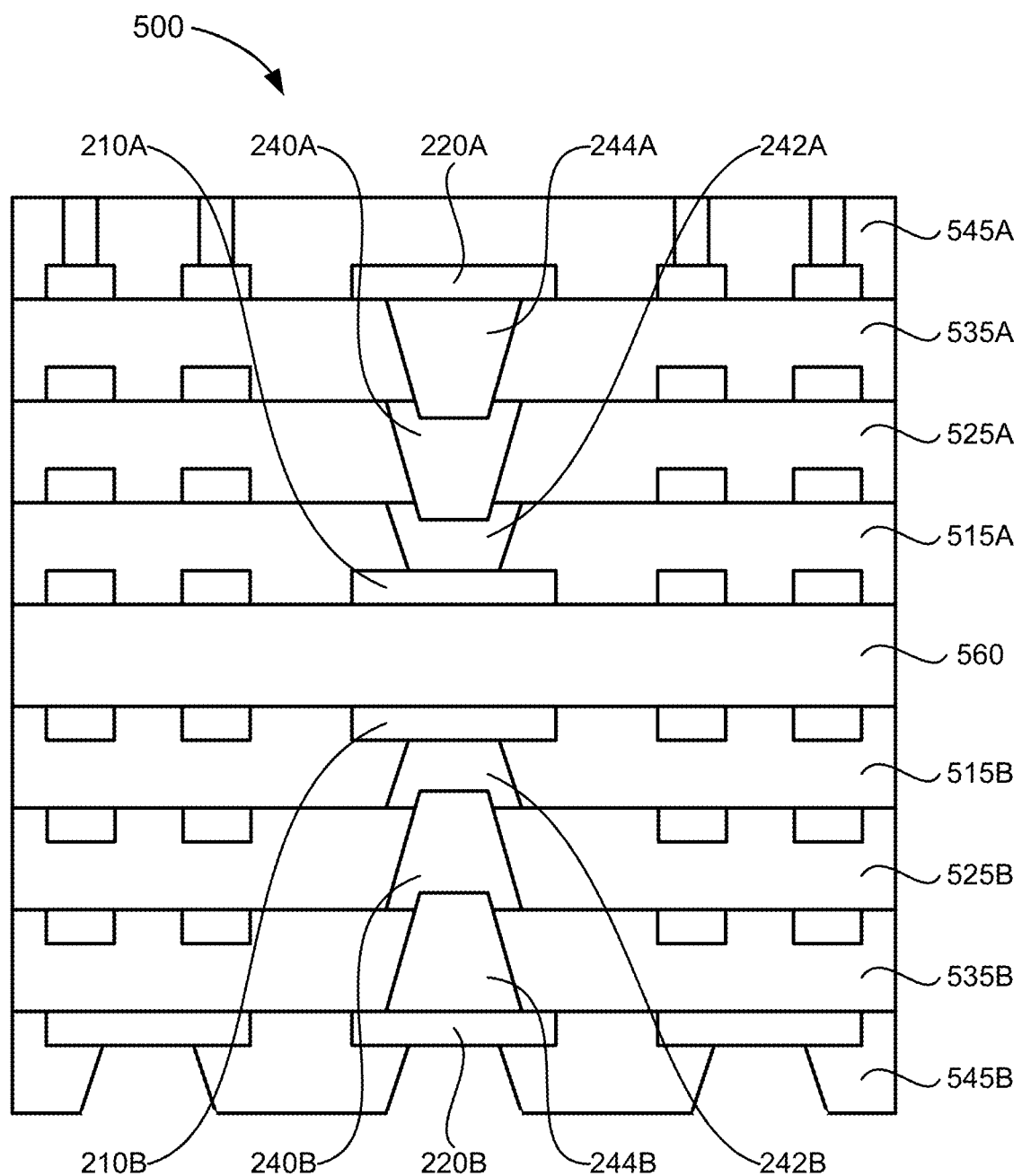

FIGS. 5A-5G illustrate examples of stages of fabricating another stack layer structure in accordance with one or more aspects of the disclosure. Before describing the stages, attention is brought to FIG. 5G illustrating an example stack layer structure 500 in which the stack via structure 200 may be incorporated. The stack layer structure 500 may be an example of a stack layer structure based on a semi-additive process (SAP) or a modified SAP (mSAP) substrates.

As seen FIG. 5G, the stack layer structure 500 may comprise an initial layer 560, also referred to as a core layer 560. Note that there are two stack via structures, one above and other below the core layer. For ease of reference, the portion of the stack layer structure 500 above the core layer 560 will be referenced with elements ending with 'A' and the portion below the core layer 560 will be referenced with elements ending with 'B'.

The portion above the core layer 560 may be similar to the stack layer structure 400 of FIG. 4I above the base layer 460. That is, the stack layer structure 500 above the initial layer 560 may comprise a capture pad 210A and an inner via 242A formed in an inner dielectric layer 515A stacked over the initial layer 560. The inner via 242A may be stacked over and electrically coupled with the capture pad 210A.

The stack layer structure 500 above the initial layer 560 may also comprise an intermediate via 240A formed in an intermediate dielectric layer 525A stacked over the inner dielectric layer 515A. Again, while one intermediate via 240A formed in one intermediate dielectric layer 525A is shown, the stack layer structure 500 may comprise one or more intermediate vias 240A formed in corresponding one or more intermediate dielectric layers 525A stacked over the inner dielectric layer 515A. The one or more intermediate vias 240A may be stacked over and electrically coupled with the inner via 242A.

The stack layer structure 500 above the initial layer 560 may further comprise an outer via 244A formed in an outer dielectric layer 535A stacked over the one or more intermediate dielectric layers 525A. The outer via 244A may be stacked over and electrically coupled with the one or more intermediate vias 240A.

The stack layer structure 500 above the initial layer 560 may yet comprise a cover pad 220A stacked over and electrically coupled with the outer via 244A. The cover pad 220A may be formed in a cover layer 545A, which may be the outermost layer of the stack layer structure 500 above the initial layer 560. The cover pad 220A may be exposed. For example, the cover pad 220A may be configured to enable a signal connection with a device external to the stack layer structure 500.

In aspect, it may be said that the stack layer structure 500 above the initial layer 560 comprises a first via 340A and a second via 340B as described with respect to FIG. 3. The second via 340B may be immediately stacked over the first via 340A. The first via 340A may be the inner via 242 or one of the one or more intermediate vias 240. The second via 340B may be one of the one or more intermediate vias 240 or the outer via 244. Details of the first and second vias 340A, 340B are provided above, and thus are not repeated here for sake of brevity.

The portion below the core layer 560 may be similar to the portion above the core layer 560, but in opposite orientation (e.g., below). Term "lower" will be used to distinguish the components below the core layer 560 from components above. The stack layer structure 500 below the initial layer 560 may comprise a lower capture pad 210B and a lower inner via 242B formed in a lower inner dielectric layer 515B stacked below the initial layer 560. The lower inner via 242B may be stacked below and electrically coupled with the lower capture pad 210B.

The stack layer structure 500 below the initial layer 560 may also comprise a lower intermediate via 240B formed in a lower intermediate dielectric layer 525B stacked below the lower inner dielectric layer 515B. While one lower intermediate via 240B formed in one lower intermediate dielectric layer 525B is shown, the stack layer structure 500 may comprise one or more lower intermediate vias 240B formed in corresponding one or more lower intermediate dielectric layers 525B stacked below the lower inner dielectric layer 515B. The one or more lower intermediate vias 240B may be stacked below and electrically coupled with the lower inner via 242B. It should be noted that the number of intermediate dielectric layers 525A above the core layer 560 may be independent of the number of lower intermediate layers 525B below the core layer 560.

The stack layer structure 500 below the initial layer 560 may further comprise a lower outer via 244B formed in a lower outer dielectric layer 535B stacked below the one or more lower intermediate dielectric layers 525B. The lower outer via 244B may be stacked below and electrically coupled with the one or more intermediate vias 240B.

The stack layer structure 500 below the initial layer 560 may yet comprise a lower cover pad 220B stacked below and electrically coupled with the lower outer via 244B. The lower cover pad 220B may be formed in a lower cover layer 545B, which may be the outermost layer of the stack layer structure 500 below the initial layer 560. The lower cover pad 220B may be exposed. For example, the lower cover pad 220B may be configured to enable a signal connection with a device external to the stack layer structure 500.

In aspect, it may be said that the stack layer structure 500 below the initial layer 560 comprises first and second lower vias, which may be similar to the first and second vias 340A, 340B as described with respect to FIG. 3, except that the orientations may be reversed (not shown). Then it may be said that the second lower via may be immediately stacked below the first lower via. The first lower via may be the lower inner via 242B or one of the one or more lower intermediate vias 240B. The lower second via may be one of the one or more lower intermediate vias 240B or the lower outer via 244B.

While stack via structures on both sides of the initial layer 560 are shown, this is merely an example. It is contemplated that the proposed stack via structure of FIGS. 2A, 2B, 3 may be on one or both sides of the initial layer 560.

Various stages of fabricating the stack layer structure 500 will now be described. For description purposes, it will be assumed that the proposed stack via structure will be formed on both above and below the of the initial layer 560. FIG. 5A illustrates a stage in which the capture pad 210A may be formed on the initial (or core) layer 560, and the lower capture pad 210B may be formed below the initial layer 560. One or both of the capture pad 210A and the lower capture pad 210B may be in contact with the initial layer 560.

FIG. 5B illustrates a stage in which the inner dielectric layer 515A may be formed on the initial layer 560 and cover the capture pad 210A. Also, the lower inner dielectric layer 515B may be formed below the initial layer 560 and cover the lower capture pad 210B. For example, the inner dielectric layer 515A may be laminated on the initial layer 560. Alternatively or in addition thereto, the lower inner dielectric layer 515B may be laminated below the initial layer 560.

FIG. 5C illustrates a stage in which the inner dielectric layer 515A may be processed to form an inner via hole 517A to expose the capture pad 210A. Similarly, the lower inner dielectric layer 515B may be processed to form a lower inner via hole 517B to expose the lower capture pad 210B. The inner via hole 517A and/or the lower inner via hole 517B may be formed by laser drilling.

FIG. 5D illustrates a stage in which the inner dielectric layer 515A and the inner via hole 517A may be plated with conductive materials (e.g., Cu, Al, etc.) to form the inner via 242A to fill the inner via hole 517A. At this stage, the recess is not yet formed in the inner via 242A. Alternatively or in addition thereto, the lower inner dielectric layer 515B and the lower inner via hole 517B may be plated with conductive materials (e.g., Cu, Al, etc.) to form the lower inner via 242B to fill the lower inner via hole 517B. At this stage, the lower recess is not yet formed in the lower inner via 242B.

FIG. 5E illustrates a stage in which an intermediate via hole 527A may be formed in the intermediate dielectric layer 525A. The intermediate dielectric layer 525A may be laminated on the inner dielectric layer 515A, and then drilled, e.g., through laser drilling. The drilling may also drill the recess in the inner via 242A.

Alternatively or in addition thereto, a lower intermediate via hole 527B may be formed in the lower intermediate dielectric layer 525B. The lower intermediate dielectric layer 525B may be laminated below the lower inner dielectric layer 515B, and then drilled, e.g., through laser drilling. The drilling may also drill the lower recess in the lower inner via 242B.

FIG. 5F illustrates a stage in which the intermediate dielectric layer 525A and the intermediate via hole 527A may be plated with conductive materials (e.g., Cu, Al, etc.) to form the intermediate via 240A to fill the intermediate via hole 527A. The intermediate via 240A may also fill the recess of the inner via 242A. At this stage, the recess is not yet formed in the intermediate via 240A.

Alternatively or in addition thereto, the lower intermediate dielectric layer 525B and the lower intermediate via hole 527B may be plated with conductive materials (e.g., Cu, Al, etc.) to form a lower intermediate via 240B to fill the lower intermediate via hole 527B. The lower intermediate via 240B may also fill the recess of the lower inner via 242B. At this stage, the lower recess is not yet formed in the lower intermediate via 240B.

FIG. 5G illustrates a stage in which the outer dielectric layer 535A may be laminated on the intermediate dielectric layer 525A and drilled (e.g., by laser), which may also form the recess in the intermediate via 240A. The outer dielectric layer 535A and the intermediate via 240A may be plated with conductive materials (e.g., Cu, Al, etc.) to form the outer via 244A, which also fills the recess of the intermediate via 240A. The cover pad 220A may be formed on the outer dielectric layer 535A, the cover layer 545A may then be formed (e.g., laminated) on the outer dielectric layer 535A and the cover pad 220A. the cover layer 545A may then be further processed, e.g., to enable connections with external devices.

Alternatively or in addition thereto, the lower outer dielectric layer 535B may be laminated below the lower intermediate dielectric layer 525B and drilled (e.g., by laser), which may also form the lower recess in the lower intermediate via 240B. The lower outer dielectric layer 535B and the lower intermediate via 240B may be plated with conductive materials (e.g., Cu, Al, etc.) to form the lower outer via 244B, which also fills the lower recess of the lower intermediate via 240B. The lower cover pad 220B may be formed below the lower outer dielectric layer 535B, the lower cover layer 545B may then be formed (e.g., laminated) below the lower outer dielectric layer 535B and the lower cover pad 220B. The lower cover layer 545B may then be further processed, e.g., to enable connections with external devices.

While not shown, it should be noted that by repeating the stages illustrated in FIGS. 5E and 5F, multiple intermediate dielectric layers 525A and corresponding multiple intermediate vias 240A may be fabricated. Alternatively or in addition thereto, multiple lower intermediate dielectric layers 525B and corresponding multiple lower intermediate vias 240B may be fabricated. Again, the number of intermediate dielectric layers 525A may be independent of the number of lower intermediate dielectric layers 525B.

Figure 6:
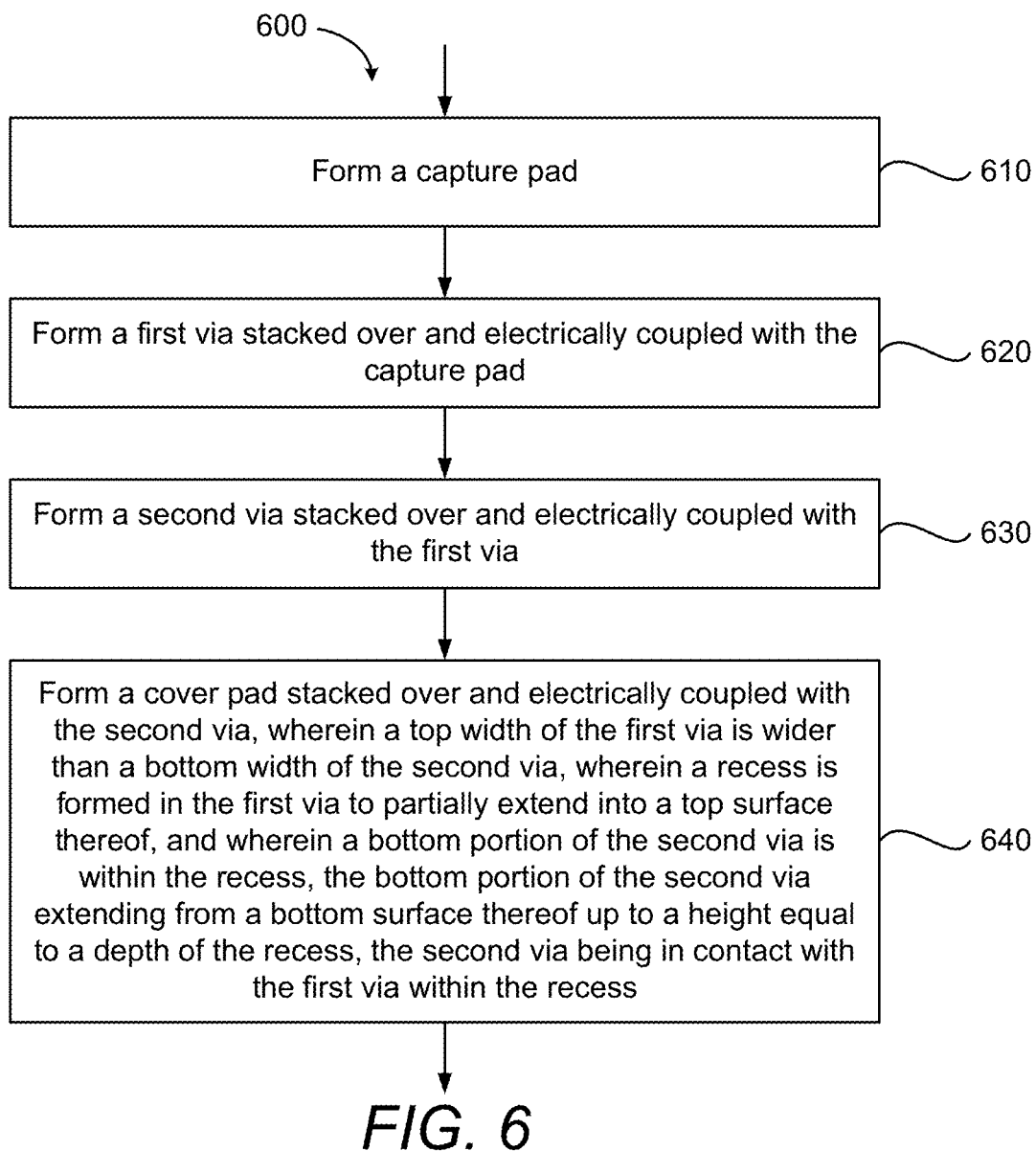
FIG. 6 illustrates a flow chart of an example method of fabricating a stack via structure in accordance with one or more aspects of the disclosure.

FIG. 6 illustrates a flow chart of an example method 600 of fabricating a stack via structure, such as the stack via structure 200, in accordance with one or more aspects of the disclosure. In block 610, a capture pad 210 may be formed.

In block 620, a first via 340A may be formed. The first via 340A may be stacked over and electrically coupled with the capture pad 210. A recess 345 may be formed to partially extend into the first via 340A from a top surface thereof. In an aspect, the recess 345 may be formed through drilling, such as laser drilling.

In block 630, the second via 340B may be formed. The second via 340B may be stacked over and electrically coupled with the first via 340A. A second bottom portion (portion of the second via 340B extending from a bottom surface thereof up to a height equal to a depth of the recess 345) may be within the recess 345. As such, the second via 340B may be in contact with the first via 340A within the recess 345. Details of the first and second vias 340A, 340B are described above with respect to FIGS. 2A, 2B and 3, and thus will not be repeated here for sake of brevity.

In block 640, a cover pad 220 may be formed. The cover pad 220 may be stacked over and electrically coupled with the second via 340B.

Figure 7:
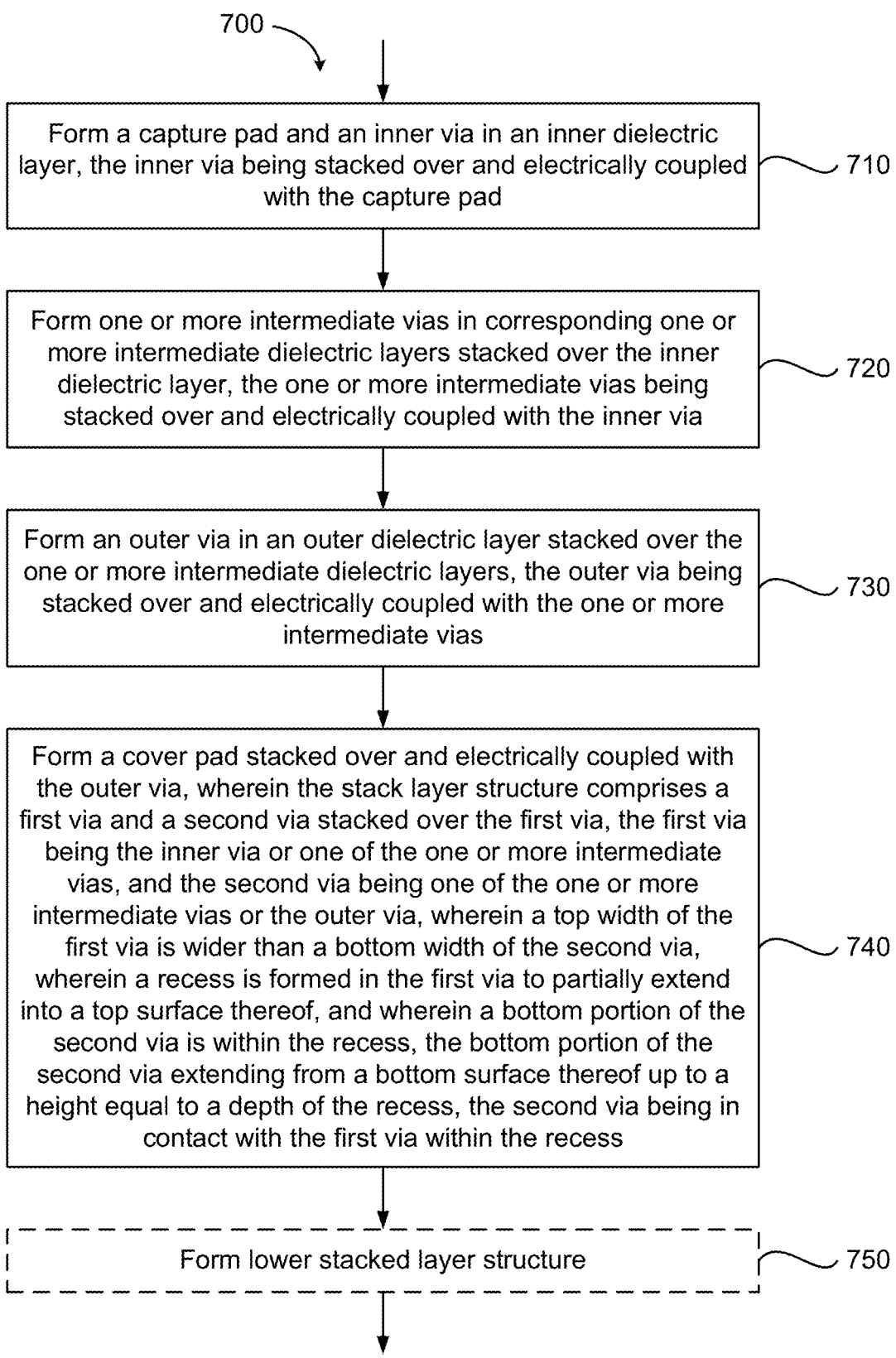
FIGS. 7 and 8 illustrate flow charts of an example method of fabricating a stack layer structure in accordance with one or more aspects of the disclosure.

FIG. 7 illustrates a flow chart of an example method 700 of fabricating a stack layer structure, such as the stack layer structure 400 or 500, in accordance with one or more aspects of the disclosure. In block 710, a capture pad 210, 210A and an inner via 242, 242A may be formed in an inner dielectric layer 415, 515A. The inner via 242, 242A may be stacked over and electrically coupled with the capture pad 210, 210A.

In block 720, one or more intermediate vias 240, 240A may be formed in corresponding one or more intermediate dielectric layers 425, 525A, which may be stacked over the inner dielectric layer 415, 515A. The one or more intermediate vias 240, 240A may be stacked over and electrically coupled with the inner via 242, 242A.

In block 730, an outer via 244, 244A may be formed in an outer dielectric layer 435, 535A, which may be stacked over the one or more intermediate dielectric layers 425, 525A. The outer via 244, 244A may be stacked over and electrically coupled with the one or more intermediate vias 240, 240A.

In an aspect, the inner via 242, 242A or one of the one or more intermediate vias 240, 240A may serve as the first via 340A. Also, one of the one or more intermediate vias 240, 240A or the outer via 244A may serve as the second via 340B. Details of the first and second vias 340A, 340B are described above with respect to FIGS. 2A, 2B and 3, and thus will not be repeated here for sake of brevity.

In block 740, a cover pad 220, 220A may be formed. The cover pad 220, 220A may be stacked over and electrically coupled with the outer via 244, 244A.

Implementing blocks 710-740 may fabricate the stack layer structure 400 or may fabricate a portion of the stack layer structure 500 above the initial layer 560. Optionally (as indicated by dashed rectangle), block 750 may be performed to fabricate a portion of the stack layer structure 500 below the initial layer 560.

Figure 8:
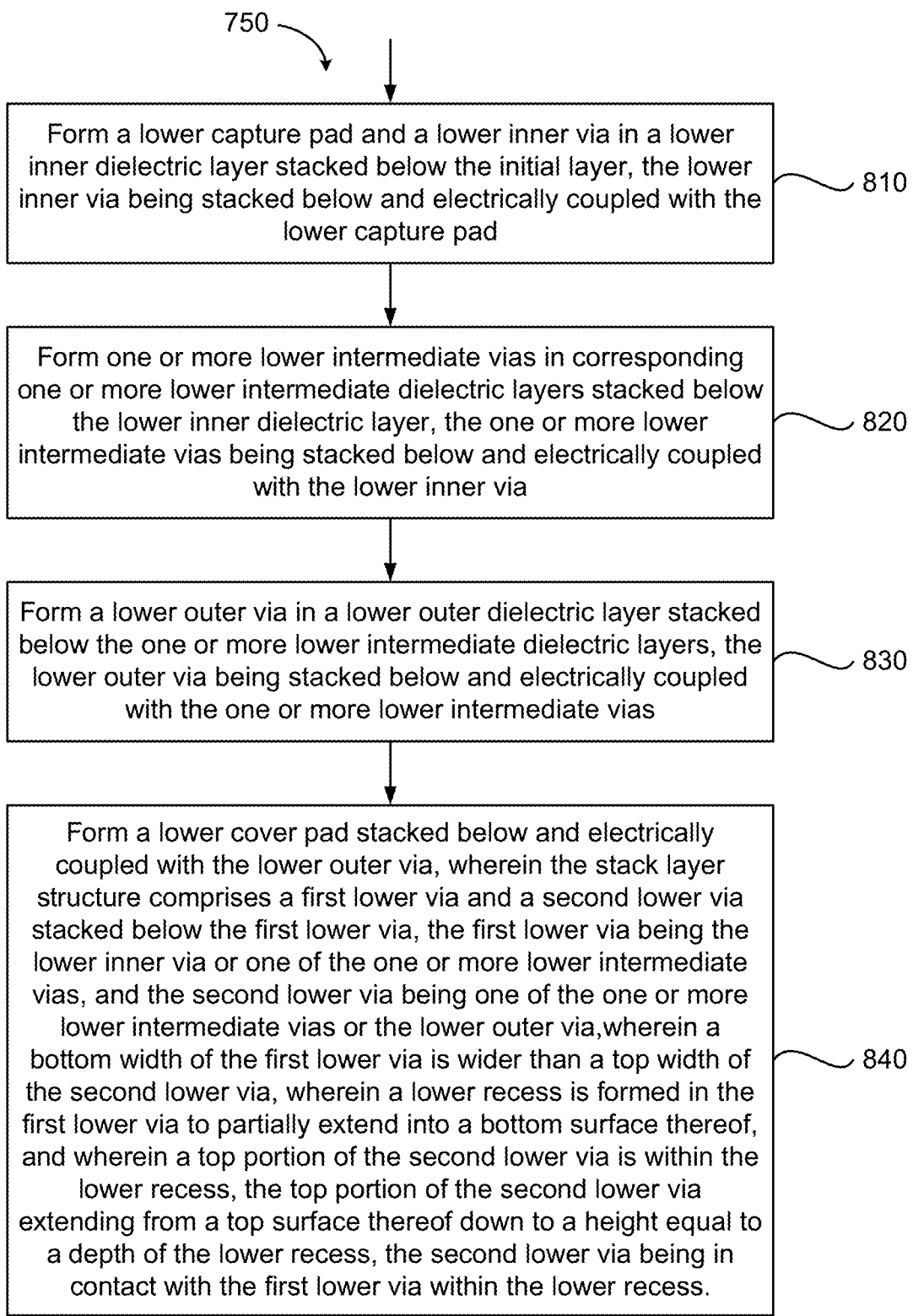

FIG. 8 illustrates a flow chart of an example process to implement block 750. In block 810, a lower capture pad 210B and a lower inner via 242B may be formed in a lower inner dielectric layer 515B. The lower inner via 242B may be stacked below and electrically coupled with the lower capture pad 210B.

In block 820, one or more lower intermediate vias 240B may be formed in corresponding one or more lower intermediate dielectric layers 525B, which may be stacked below the lower inner dielectric layer 515B. The one or more lower intermediate vias 240B may be stacked below and electrically coupled with the lower inner via 242B.

In block 830, a lower outer via 244B may be formed in a lower outer dielectric layer 535B, which may be stacked below the one or more lower intermediate dielectric layers 525B. The lower outer via 244B may be stacked below and electrically coupled with the one or more lower intermediate vias 240B.

In an aspect, the lower inner via 242B or one of the one or more lower intermediate vias 240B may serve as the first lower via. Also, one of the one or more lower intermediate vias 240B or the lower outer via 244B may serve as the second lower via. Details of the first and second lower vias are described above, and thus will not be repeated here for sake of brevity.

In block 840, a lower cover pad 220B may be formed. The lower cover pad 220B may be stacked below and electrically coupled with the lower outer via 244B.

Figure 9:
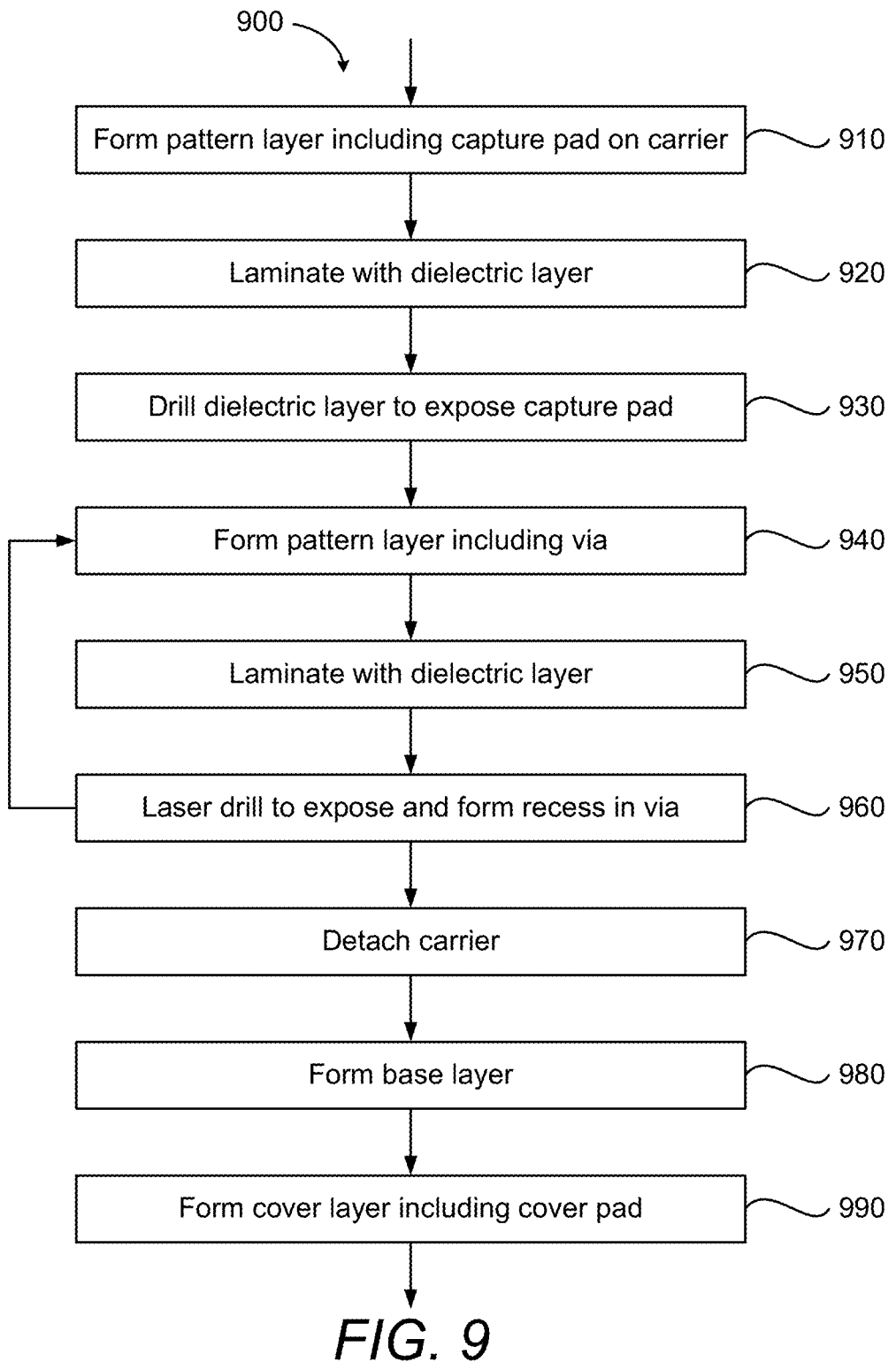
FIG. 9 illustrates a flow chart of another example method of fabricating a stack layer structure in accordance with one or more aspects of the disclosure.

FIG. 9 illustrates a flow chart of another example method 900 of fabricating a stack layer structure, such as the stack layer structure 400, in accordance with one or more aspects of the disclosure. In block 910, a pattern layer may be formed on a carrier (e.g. carrier 405). A capture pad (e.g., capture pad 210) may be formed as a part of the pattern layer.

In block 920, the carrier (e.g., carrier 405) may be laminated with a dielectric layer (e.g., inner dielectric layer 415).

In block 930, the dielectric layer (e.g., inner dielectric layer 415) may be drilled to expose the capture pad (e.g., capture pad 210).

In block 940, a pattern layer may be formed on the dielectric layer (e.g., inner dielectric layer 415, intermediate dielectric layer 425). The pattern layer may include a via (e.g., inner via 242, intermediate via 240).

In block 950, the dielectric layer (e.g., inner dielectric layer 415, intermediate dielectric layer 425) may be laminated with another dielectric layer (e.g., intermediate dielectric layer 425, outer dielectric layer 435).

In block 960, the another dielectric layer (e.g., intermediate dielectric layer 425, outer dielectric layer 435) may be drilled to expose the via (e.g., inner via 242, intermediate via 240).

Blocks 940, 950, 960 may be repeated multiple times to form one or more intermediate dielectric layers (e.g., one or more intermediate dielectric layers 425) and corresponding one or more intermediate vias (e.g., one or more intermediate vias 240). On the final repetition of blocks 940, 950, 960, an outer dielectric layer (e.g., outer dielectric layer 435) and an outer via (e.g., outer via 244) may be formed.

In block 970, the carrier (e.g., carrier 405) may be detached.

In block 980, a base layer (e.g., base layer 460) may be formed. The base layer may be below and in contact with the inner dielectric layer (e.g., inner dielectric layer 415).

In block 990, a cover layer (e.g., cover layer 445) including a cover pad (e.g., cover pad 220) may be formed on the outer dielectric layer (e.g., outer dielectric layer 435).

Figure 10:
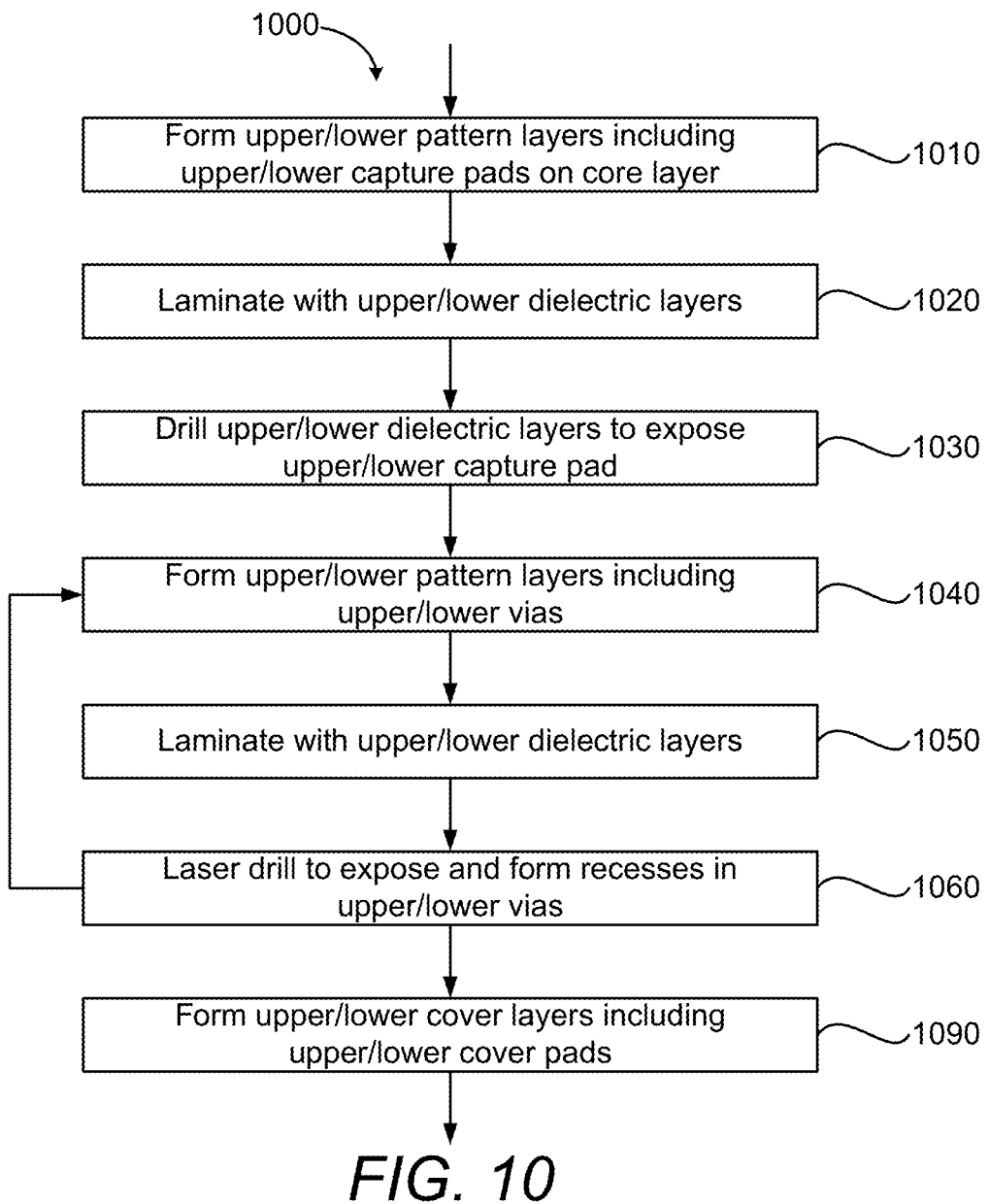
FIG. 10 illustrates a flow chart of a further example method of fabricating a stack layer structure in accordance with one or more aspects of the disclosure.

FIG. 10 illustrates a flow chart of a further example method 1000 of fabricating a stack layer structure, such as the stack layer structure 500, in accordance with one or more aspects of the disclosure. In block 1010, an upper pattern layer may be formed on a core layer (e.g., core layer 560). An upper capture pad (e.g., capture pad 210A) may be formed as a part of the upper pattern layer. Alternatively or in addition thereto, a lower pattern layer may be formed below the core layer. A lower capture pad (e.g., lower capture pad 210B) may be formed as a part of the lower pattern layer.

In block 1020, an upper dielectric layer (e.g., inner dielectric layer 515A) may be laminated on the core layer (e.g., core layer 560). Alternatively or in addition thereto, a lower dielectric layer (e.g., lower inner dielectric layer 515B) may be laminated below the core layer.

In block 1030, the upper dielectric layer (e.g., inner dielectric layer 515A) may be drilled to expose the upper capture pad (e.g., capture pad 210A). Alternatively or in addition thereto, the lower dielectric layer (e.g., lower inner dielectric layer 515B) may be drilled to expose the lower capture pad (e.g., lower capture pad 210B).

In block 1040, an upper pattern layer may be formed on the upper dielectric layer (e.g., inner dielectric layer 515A, intermediate dielectric layer 525A). The upper pattern layer may include an upper via (e.g., inner via 242A, intermediate via 240A). Alternatively or in addition thereto, a lower pattern layer may be formed below the lower dielectric layer (e.g., lower inner dielectric layer 515B, lower intermediate dielectric layer 525B). The lower pattern layer may include a lower via (e.g., lower inner via 242B, lower intermediate via 240B).

In block 1050, the upper dielectric layer (e.g., inner dielectric layer 515A, intermediate dielectric layer 525A) may be laminated with another upper dielectric layer (e.g., intermediate dielectric layer 525A, outer dielectric layer 535A). Alternatively or in addition thereto, the lower dielectric layer (e.g., lower inner dielectric layer 515B, lower intermediate dielectric layer 525B) may be laminated with another lower dielectric layer (e.g., lower intermediate dielectric layer 525B, lower outer dielectric layer 535B).

In block 1060, the another upper dielectric layer (e.g., intermediate dielectric layer 525A, outer dielectric layer 535A) may be drilled to expose the upper via (e.g., inner via 242A, intermediate via 240A). Alternatively or in addition thereto, the another lower dielectric layer (e.g., lower intermediate dielectric layer 525B, lower outer dielectric layer 535B) may be drilled to expose the lower via (e.g., lower inner via 242B, intermediate via 240B).

Blocks 1040, 1050, 1060 may be repeated multiple times to form one or more upper intermediate dielectric layers (e.g., one or more intermediate dielectric layers 525A) and corresponding one or more upper intermediate vias (e.g., one or more intermediate vias 240A). Alternatively or in addition thereto, blocks 1040, 1050, 1060 may be repeated multiple times to form one or more lower intermediate dielectric layers (e.g., one or more lower intermediate dielectric layers 525B) and corresponding one or more lower intermediate vias (e.g., one or more lower intermediate vias 240B).

On the final repetition of blocks 1040, 1050, 1060, an upper outer dielectric layer (e.g., outer dielectric layer 535A) and an upper outer via (e.g., outer via 244A) may be formed. Alternatively or in addition thereto, a lower outer dielectric layer (e.g., lower outer dielectric layer 535B) and a lower outer via (e.g., lower outer via 244B) may be formed.

In block 1090, an upper cover layer (e.g., cover layer 545A) including an upper cover pad (e.g., cover pad 220A) may be formed on the upper outer dielectric layer (e.g., outer dielectric layer 535A). Alternatively or in addition thereto, a lower cover layer (e.g., lower cover layer 545B) including a lower cover pad (e.g., lower cover pad 220B) may be formed below the lower outer dielectric layer (e.g., lower outer dielectric layer 535B).

It will be appreciated that the foregoing fabrication processes and related discussion were provided merely as a general illustration of some of the aspects of the disclosure and is not intended to limit the disclosure or accompanying claims. Further, many details in the fabrication process known to those skilled in the art may have been omitted or combined in summary process portions to facilitate an understanding of the various aspects disclosed without a detailed rendition of each detail and/or all possible process variations. Further, it will be appreciated that the illustrated configurations and descriptions are provided merely to aid in the explanation of the various aspects disclosed herein. For example, the number and location of the inductors, the metallization structure may have more or less conductive and insulating layers, the cavity orientation, size, whether it is formed of multiple cavities, is closed or open, and other aspects may have variations driven by specific application design features, such as the number of antennas, antenna type, frequency range, power, etc. Accordingly, the forgoing illustrative examples and associated figures should not be construed to limit the various aspects disclosed and claimed herein.

Figure 11:
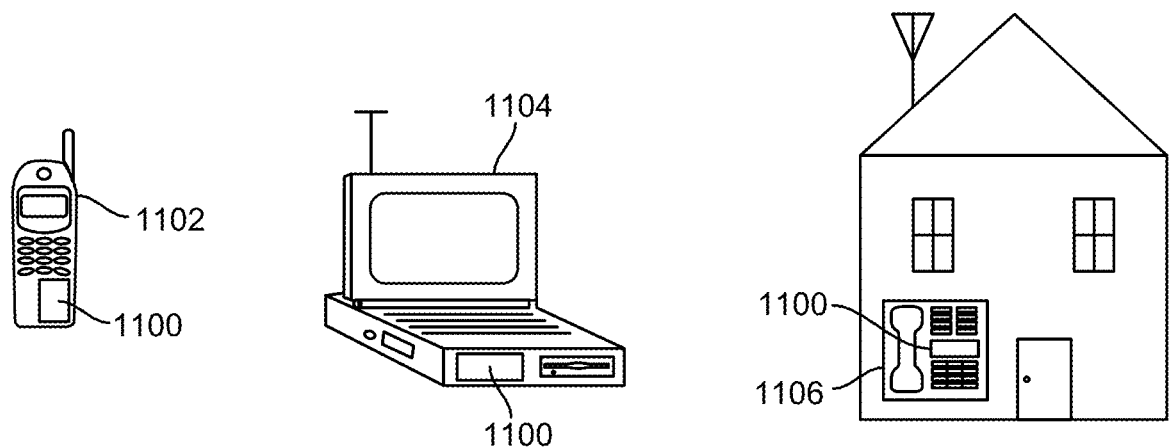
FIG. 11 illustrates various electronic devices which may utilize one or more aspects of the disclosure.

FIG. 11 illustrates various electronic devices which may utilize one or more aspects of the disclosure. For example, a mobile phone device 1102, a laptop computer device 1104, and a fixed location terminal device 1106 may each be considered generally user equipment (UE) and may include any of the structures 1100 (e.g., the stack via structure 200, the stack layer structure 400, or the stack layer structure 500) as described herein. The devices 1102, 1104, 1106 illustrated in FIG. 11 are merely exemplary. Other electronic devices may also include the stack via structure and/or the stack layer structure including, but not limited to, a group of devices (e.g., electronic devices) that includes mobile devices, hand-held personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

The foregoing disclosed devices and functionalities may be designed and configured into computer files (e.g., RTL, GDSII, GERBER, etc.) stored on computer-readable media. Some or all such files may be provided to fabrication handlers who fabricate devices based on such files. Resulting products may include semiconductor wafers that are then cut into semiconductor die and packaged into an antenna on glass device. The antenna on glass device may then be employed in devices described herein.

Implementation examples are described in the following numbered clauses:

Clause 1: A stack via structure, comprising: a capture pad; a first via stacked over and electrically coupled with the capture pad; a second via stacked over and electrically coupled with the first via; and a cover pad stacked over and electrically coupled with the second via, wherein a top width of the first via is wider than a bottom width of the second via, wherein a recess is formed in the first via to partially extend into a top surface thereof, and wherein a bottom portion of the second via is within the recess, the bottom portion of the second via extending from a bottom surface thereof up to a height equal to a depth of the recess, the second via being in contact with the first via within the recess.

The stack via structure of clause 1, wherein the first via is tapered such that the top width thereof is wider than a bottom width thereof, wherein the second via is tapered such that a top width thereof is wider than the bottom width thereof, and wherein the recess is tapered such that a top width thereof is wider than a bottom width thereof.

Clause 3: The stack via structure of any of clauses 1-2, wherein a side surface of the bottom portion of the second via is in contact with a side surface of the recess, and a bottom surface of the bottom portion of the second via is in contact with a bottom surface of the recess.

Clause 4: The stack via structure of any of clauses 1-3, wherein there is no capture pad between the first via and the second via.

Clause 5: The stack via structure of any of clauses 1-4, wherein the second via is electrically coupled with another via at a same layer through a pattern line, the second via being in contact with the pattern line.

Clause 6: The stack via structure of any of clauses 1-5, wherein the cover pad is a pad within a cover layer of a stack layer structure that comprises the stack via structure, the cover layer being an outermost layer of the stack layer structure, and the cover pad being configured to enable a signal connection with an external device.

Clause 7: The stack via structure of any of clauses 1-6, wherein between the first via and the second via, the capture pad is electrically coupled to the cover pad through the first via and the second via in that order.

Clause 8: The stack via structure of any of clauses 1-7, wherein the first via is formed from copper (Cu), the second via is formed from copper (Cu), or both.

Clause 9: The stack via structure of any of clauses 1-8, wherein the depth of the recess ranges between 5% and 15% of a height of the first via.

Clause 10: The stack via structure of any of clauses 1-9, wherein the stack via structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 11: A method of fabricating a stack via structure, the method comprising: forming a capture pad; forming a first via stacked over and electrically coupled with the capture pad; forming a second via stacked over and electrically coupled with the first via; and forming a cover pad stacked over and electrically coupled with the second via, wherein a top width of the first via is wider than a bottom width of the second via, wherein a recess is formed in the first via to partially extend into a top surface thereof, and wherein a bottom portion of the second via is within the recess, the bottom portion of the second via extending from a bottom surface thereof up to a height equal to a depth of the recess, the second via being in contact with the first via within the recess.

Clause 12: The method of clause 11, wherein the first via is tapered such that the top width thereof is wider than a bottom width thereof, wherein the second via is tapered such that a top width thereof is wider than the bottom width thereof, and wherein the recess is tapered such that a top width thereof is wider than a bottom width thereof.

Clause 13: The method of any of clauses 11-12, wherein a side surface of the bottom portion of the second via is in contact with a side surface of the recess, and a bottom surface of the bottom portion of the second via is in contact with a bottom surface of the recess.

Clause 14: The method of any of clauses 11-13, wherein there is no capture pad between the first via and the second via.

Clause 15: The method of any of clauses 11-14, wherein the second via is electrically coupled with another via at a same layer through a pattern line, the second via being in contact with the pattern line.

Clause 16: The method of any of clauses 11-15, wherein the cover pad is a pad within a cover layer of a stack layer structure that comprises the stack via structure, the cover layer being an outermost layer of the stack layer structure, and the cover pad being configured to enable a signal connection with an external device.

Clause 17: The method of any of clauses 11-16, wherein between the first via and the second via, the capture pad is electrically coupled to the cover pad through the first via and the second via in that order.

Clause 18: The method of any of clauses 11-17, wherein the first via is formed from copper (Cu), the second via is formed from copper (Cu), or both.

Clause 19: The method of any of clauses 11-18, wherein the depth of the recess ranges between 5% and 15% of a height of the first via.

Clause 20: The method of any of clauses 11-19, wherein the top surface of the first via is drilled to form the recess, and wherein the bottom portion of the second via fills the recess when the second via is being formed.

Clause 21: The method of clause 20, wherein the recess is formed by laser drilling the top surface of the first via.

Clause 22: A stack layer structure, comprising: a capture pad and an inner via formed in an inner dielectric layer, the inner via being stacked over and electrically coupled with the capture pad; one or more intermediate vias formed in corresponding one or more intermediate dielectric layers stacked over the inner dielectric layer, the one or more intermediate vias being stacked over and electrically coupled with the inner via; an outer via formed in an outer dielectric layer stacked over the one or more intermediate dielectric layers, the outer via being stacked over and electrically coupled with the one or more intermediate vias; and a cover pad stacked over and electrically coupled with the outer via, wherein the stack layer structure comprises a first via and a second via stacked over the first via, the first via being the inner via or one of the one or more intermediate vias, and the second via being one of the one or more intermediate vias or the outer via, wherein a top width of the first via is wider than a bottom width of the second via, wherein a recess is formed in the first via to partially extend into a top surface thereof, and wherein a bottom portion of the second via is within the recess, the bottom portion of the second via extending from a bottom surface thereof up to a height equal to a depth of the recess, the second via being in contact with the first via within the recess.

Clause 23: The stack layer structure of clause 22, wherein the first via is tapered such that the top width thereof is wider than a bottom width thereof, wherein the second via is tapered such that a top width thereof is wider than the bottom width thereof, and wherein the recess is tapered such that a top width thereof is wider than a bottom width thereof.

Clause 24: The stack layer structure of any of clauses 22-23, wherein a side surface of the bottom portion of the second via is in contact with a side surface of the recess, and a bottom surface of the bottom portion of the second via is in contact with a bottom surface of the recess.

Clause 25: The stack layer structure of any of clauses 22-24, wherein there is no capture pad between the first via and the second via.

Clause 26: The stack layer structure of any of clauses 22-25, wherein the second via is electrically coupled with another via at a same layer through a pattern line, the second via being in contact with the pattern line.

Clause 27: The stack layer structure of any of clauses 22-26, further comprising: a cover layer stacked over the outer dielectric layer, the cover layer being an outermost layer of the stack layer structure, wherein the cover pad is formed in the cover layer and is configured to enable a signal connection with an external device.

Clause 28: The stack layer structure of any of clauses 22-27, wherein between the first via and the second via, the capture pad is electrically coupled to the cover pad through the first via and the second via in that order.

Clause 29: The stack layer structure of any of clauses 22-28, wherein the first via is formed from copper (Cu), the second via is formed from copper (Cu), or both.

Clause 30: The stack layer structure of any of clauses 22-29, wherein the depth of the recess ranges between 5% and 15% of a height of the first via.

Clause 31: The stack layer structure of any of clauses 22-30, further comprising: an initial layer stacked below the inner dielectric layer, wherein the capture pad is on and in contact with the initial layer.

Clause 32: The stack layer structure of clause 31, wherein the capture pad, the inner via, the inner dielectric layer, the one or more intermediate vias, the one or more intermediate dielectric layers, the outer via, the outer dielectric layer, and the cover pad are formed above the initial layer, wherein the stack layer structure further comprises: a lower capture pad and a lower inner via formed in a lower inner dielectric layer stacked below the initial layer, the lower inner via being stacked below and electrically coupled with the lower capture pad; one or more lower intermediate vias formed in corresponding one or more lower intermediate dielectric layers stacked below the lower inner dielectric layer, the one or more lower intermediate vias being stacked below and electrically coupled with the lower inner via; a lower outer via formed in a lower outer dielectric layer stacked below the one or more lower intermediate dielectric layers, the lower outer via being stacked below and electrically coupled with the one or more lower intermediate vias; and a lower cover pad stacked below and electrically coupled with the lower outer via, wherein the stack layer structure comprises a first lower via and a second lower via stacked below the first lower via, the first lower via being the lower inner via or one of the one or more lower intermediate vias, and the second lower via being one of the one or more lower intermediate vias or the lower outer via, wherein a bottom width of the first lower via is wider than a top width of the second lower via, wherein a lower recess is formed in the first lower via to partially extend into a bottom surface thereof, and wherein a top portion of the second lower via is within the lower recess, the top portion of the second lower via extending from a top surface thereof down to a height equal to a depth of the lower recess, the second lower via being in contact with the first lower via within the lower recess.

Clause 33: The stack layer structure of any of clauses 22-32, wherein the stack layer structure is a structure of an embedded trace substrate (ETS), a semi-additive process (SAP) substrate, or a modified semi-additive process (mSAP) substrate.

Clause 34: The stack layer structure of any of clauses 22-33, wherein the stack layer structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

Clause 35: A method of fabricating a stack layer structure, the method comprising: forming a capture pad and an inner via in an inner dielectric layer, the inner via being stacked over and electrically coupled with the capture pad; forming one or more intermediate vias in corresponding one or more intermediate dielectric layers stacked over the inner dielectric layer, the one or more intermediate vias being stacked over and electrically coupled with the inner via; forming an outer via in an outer dielectric layer stacked over the one or more intermediate dielectric layers, the outer via being stacked over and electrically coupled with the one or more intermediate vias; and forming a cover pad stacked over and electrically coupled with the outer via, wherein the stack layer structure comprises a first via and a second via stacked over the first via, the first via being the inner via or one of the one or more intermediate vias, and the second via being one of the one or more intermediate vias or the outer via, wherein a top width of the first via is wider than a bottom width of the second via, wherein a recess is formed in the first via to partially extend into a top surface thereof, and wherein a bottom portion of the second via is within the recess, the bottom portion of the second via extending from a bottom surface thereof up to a height equal to a depth of the recess, the second via being in contact with the first via within the recess.

Clause 36: The method of clause 35, wherein the first via is tapered such that the top width thereof is wider than a bottom width thereof, wherein the second via is tapered such that a top width thereof is wider than the bottom width thereof, and wherein the recess is tapered such that a top width thereof is wider than a bottom width thereof.

Clause 37: The method of any of clauses 35-36, wherein a side surface of the bottom portion of the second via is in contact with a side surface of the recess, and a bottom surface of the bottom portion of the second via is in contact with a bottom surface of the recess.

Clause 38: The method of any of clauses 35-37, wherein there is no capture pad between the first via and the second via.

Clause 39: The method of any of clauses 35-38, wherein the second via is electrically coupled with another via at a same layer through a pattern line, the second via being in contact with the pattern line.

Clause 40: The method of any of clauses 35-39, further comprising: forming a cover layer stacked over the outer dielectric layer, the cover layer being an outermost layer of the stack layer structure, wherein the cover pad is formed in the cover layer and is configured to enable a signal connection with an external device.

Clause 41: The method of any of clauses 35-40, wherein between the first via and the second via, the capture pad is electrically coupled to the cover pad through the first via and the second via in that order.

Clause 42: The method of any of clauses 35-41, wherein the first via is formed from copper (Cu), the second via is formed from copper (Cu), or both.

Clause 43: The method of any of clauses 35-42, wherein the depth of the recess ranges between 5% and 15% of a height of the first via.

Clause 44: The method of any of clauses 35-43, further comprising: forming an initial layer stacked below the inner dielectric layer, wherein the capture pad is on and in contact with the initial layer.

Clause 45: The method of clause 44, wherein the capture pad, the inner via, the inner dielectric layer, the one or more intermediate vias, the one or more intermediate dielectric layers, the outer via, the outer dielectric layer, and the cover pad are formed above an initial layer, wherein the method further comprises: forming a lower capture pad and a lower inner via in a lower inner dielectric layer stacked below the initial layer, the lower inner via being stacked below and electrically coupled with the lower capture pad; forming one or more lower intermediate vias in corresponding one or more lower intermediate dielectric layers stacked below the lower inner dielectric layer, the one or more lower intermediate vias being stacked below and electrically coupled with the lower inner via; forming a lower outer via in a lower outer dielectric layer stacked below the one or more lower intermediate dielectric layers, the lower outer via being stacked below and electrically coupled with the one or more lower intermediate vias; and forming a lower cover pad stacked below and electrically coupled with the lower outer via, wherein the stack layer structure comprises a first lower via and a second lower via stacked below the first lower via, the first lower via being the lower inner via or one of the one or more lower intermediate vias, and the second lower via being one of the one or more lower intermediate vias or the lower outer via, wherein a bottom width of the first lower via is wider than a top width of the second lower via, wherein a lower recess is formed in the first lower via to partially extend into a bottom surface thereof, and wherein a top portion of the second lower via is within the lower recess, the top portion of the second lower via extending from a top surface thereof down to a height equal to a depth of the lower recess, the second lower via being in contact with the first lower via within the lower recess.

Clause 46: The method of any of clauses 35-45, wherein the stack layer structure is a structure of an embedded trace substrate (ETS), a semi-additive process (SAP) substrate, or a modified semi-additive process (mSAP) substrate.

Clause 47: The method of any of clauses 35-46, wherein the top surface of the first via is drilled to form the recess, and wherein the bottom portion of the second via fills the recess when the second via is being formed.

Clause 48, The method of clause 47, wherein the recess is formed by laser drilling the top surface of the first via.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described herein can be configured to perform at least a portion of a method described herein.

It should be noted that the terms "connected," "coupled," or any variant thereof, mean any connection or coupling, either direct or indirect, between elements, and can encompass a presence of an intermediate element between two elements that are "connected" or "coupled" together via the intermediate element unless the connection is expressly disclosed as being directly connected.

Any reference herein to an element using a designation such as "first," "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or one or more claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions and/or functionalities of the methods disclosed.

Furthermore, in some examples, an individual action can be subdivided into one or more sub-actions or contain one or more sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

What is claimed is:

1. A stack via structure, comprising:
a capture pad;
a first via stacked over and electrically coupled with the capture pad;
a second via stacked over and electrically coupled with the first via;

a cover pad stacked over and electrically coupled with the second via;

a first dielectric layer encapsulating sides of the first via, wherein a top surface of the first via and a top surface of the first dielectric layer are coplanar; and a second dielectric layer formed on the first dielectric layer and encapsulating sides of the second via, wherein a top width the first via is wider than a bottom width of the second via, wherein a recess is formed in the first via to partially extend into the top surface thereof, and wherein a bottom portion of the second via is within the recess, the bottom portion of the second via extending from a bottom surface thereof up to a height equal to a depth of the recess, the second via being in contact with the first via within the recess.

2. The stack via structure of claim 1, wherein the first via is tapered such that the top width thereof is wider than a bottom width thereof, wherein the second via is tapered such that a top width thereof is wider than the bottom width thereof, and wherein the recess is tapered such that a top width thereof is wider than a bottom width thereof.

3. The stack via structure of claim 1, wherein a side surface of the bottom portion of the second via is in contact with a side surface of the recess, and a bottom surface of the bottom portion of the second via is in contact with a bottom surface of the recess.

4. The stack via structure of claim 1, wherein there is no capture pad between the first via and the second via.

5. The stack via structure of claim 1, wherein the second via is electrically coupled with another via at a same layer through a pattern line, the second via being in contact with the pattern line.

6. The stack via structure of claim 1, wherein the cover pad is a pad within a cover layer of a stack layer structure that comprises the stack via structure, the cover layer being an outermost layer of the stack layer structure, and the cover pad being configured to enable a signal connection with an external device.

7. The stack via structure of claim 1, wherein between the first via and the second via, the capture pad is electrically coupled to the cover pad through the first via and the second via in that order.

8. The stack via structure of claim 1, wherein the first via is formed from copper (Cu), the second via is formed from copper (Cu), or both.

9. The stack via structure of claim 1, wherein the depth of the recess ranges between 5% and 15% of a height of the first via.

10. The stack via structure of claim 1, wherein the stack via structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

11. A stack layer structure, comprising:

a capture pad and an inner via formed in an inner dielectric layer, the inner via being stacked over and electrically coupled with the capture pad, wherein a top surface of the inner via and a top surface of the inner dielectric layer are coplanar;

one or more intermediate vias formed in corresponding one or more intermediate dielectric layers stacked over the inner dielectric layer, the one or more intermediate vias being stacked over and electrically coupled with the inner via, wherein top surfaces of the one or more intermediate vias and top surfaces of the corresponding one or more intermediate dielectric layers are coplanar;

an outer via formed in an outer dielectric layer stacked over the one or more intermediate dielectric layers, the outer via being stacked over and electrically coupled with the one or more intermediate vias; and a cover pad stacked over and electrically coupled with the outer via, wherein the stack layer structure comprises a first via and a second via stacked over the first via, the first via being the inner via or one of the one or more intermediate vias, and the second via being one of the one or more intermediate vias or the outer via, wherein a top width the first via is wider than a bottom width of the second via, wherein a recess is formed in the first via to partially extend into a top surface thereof, and wherein a bottom portion of the second via is within the recess, the bottom portion of the second via extending from a bottom surface thereof up to a height equal to a depth of the recess, the second via being in contact with the first via within the recess.

12. The stack layer structure of claim 11, wherein the first via is tapered such that the top width thereof is wider than a bottom width thereof, wherein the second via is tapered such that a top width thereof is wider than the bottom width thereof, and wherein the recess is tapered such that a top width thereof is wider than a bottom width thereof.

13. The stack layer structure of claim 11, wherein a side surface of the bottom portion of the second via is in contact with a side surface of the recess, and a bottom surface of the bottom portion of the second via is in contact with a bottom surface of the recess.

14. The stack layer structure of claim 11, wherein there is no capture pad between the first via and the second via.

15. The stack layer structure of claim 11, wherein the second via is electrically coupled with another via at a same layer through a pattern line, the second via being in contact with the pattern line.

16. The stack layer structure of claim 11, further comprising:

a cover layer stacked over the outer dielectric layer, the cover layer being an outermost layer of the stack layer structure, wherein the cover pad is formed in the cover layer and is configured to enable a signal connection with an external device.

17. The stack layer structure of claim 11, wherein between the first via and the second via, the capture pad is electrically coupled to the cover pad through the first via and the second via in that order.

18. The stack layer structure of claim 11, wherein the first via is formed from copper (Cu), the second via is formed from copper (Cu), or both.

19. The stack layer structure of claim 11, wherein the depth of the recess ranges between 5% and 15% of a height of the first via.

20. The stack layer structure of claim 11, further comprising:

an initial layer stacked below the inner dielectric layer, wherein the capture pad is on and in contact with the initial layer.

21. The stack layer structure of claim 20,
wherein the capture pad, the inner via, the inner dielectric layer, the one or more intermediate vias, the one or more intermediate dielectric layers, the outer via, the outer dielectric layer, and the cover pad are formed above the initial layer,
wherein the stack layer structure further comprises:
a lower capture pad and a lower inner via formed in a lower inner dielectric layer stacked below the initial layer, the lower inner via being stacked below and electrically coupled with the lower capture pad;
one or more lower intermediate vias formed in corresponding one or more lower intermediate dielectric layers stacked below the lower inner dielectric layer, the one or more lower intermediate vias being stacked below and electrically coupled with the lower inner via;
a lower outer via formed in a lower outer dielectric layer stacked below the one or more lower intermediate dielectric layers, the lower outer via being stacked below and electrically coupled with the one or more lower intermediate vias; and
a lower cover pad stacked below and electrically coupled with the lower outer via,
wherein the stack layer structure comprises a first lower via and a second lower via stacked below the first lower via, the first lower via being the lower inner via or one of the one or more lower intermediate vias, and the second lower via being one of the one or more lower intermediate vias or the lower outer via,
wherein a bottom width of the first lower via is wider than a top width of the second lower via,
wherein a lower recess is formed in the first lower via to partially extend into a bottom surface thereof, and
wherein a top portion of the second lower via is within the lower recess, the top portion of the second lower via extending from a top surface thereof down to a height equal to a depth of the lower recess, the second lower via being in contact with the first lower via within the lower recess.

22. The stack layer structure of claim 11, wherein the stack layer structure is a structure of an embedded trace substrate (ETS), a semi-additive process (SAP) substrate, or a modified semi-additive process (mSAP) substrate.

23. The stack layer structure of claim 11, wherein the stack layer structure is incorporated into an apparatus selected from the group consisting of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, and a device in an automotive vehicle.

24. A method of fabricating a stack via structure, the method comprising:
forming a capture pad;
forming a first via stacked over and electrically coupled with the capture pad;
forming a second via stacked over and electrically coupled with the first via;
forming a cover pad stacked over and electrically coupled with the second via;
forming a first dielectric layer encapsulating sides of the first via, wherein a top surface of the first via and a top surface of the first dielectric layer are coplanar; and
forming a second dielectric layer formed on the first dielectric layer and encapsulating sides of the second via,
wherein a top width the first via is wider than a bottom width of the second via,
wherein a recess is formed in the first via to partially extend into the top surface thereof, and
wherein a bottom portion of the second via is within the recess, the bottom portion of the second via extending from a bottom surface thereof up to a height equal to a depth of the recess, the second via being in contact with the first via within the recess.

25. The method of claim 24,
wherein the top surface of the first via is drilled to form the recess, and
wherein the bottom portion of the second via fills the recess when the second via is being formed.

26. The method of claim 25, wherein the recess is formed by laser drilling the top surface of the first via.

27. A method of fabricating a stack layer structure, the method comprising:
forming a capture pad and an inner via in an inner dielectric layer, the inner via being stacked over and electrically coupled with the capture pad, wherein a top surface of the inner via and a top surface of the inner dielectric layer are coplanar;
forming one or more intermediate vias in corresponding one or more intermediate dielectric layers stacked over the inner dielectric layer, the one or more intermediate vias being stacked over and electrically coupled with the inner via, wherein top surfaces of the one or more intermediate vias and top surfaces of the corresponding one or more intermediate dielectric layers are coplanar;
forming an outer via in an outer dielectric layer stacked over the one or more intermediate dielectric layers, the outer via being stacked over and electrically coupled with the one or more intermediate vias; and
forming a cover pad stacked over and electrically coupled with the outer via,
wherein the stack layer structure comprises a first via and a second via stacked over the first via, the first via being the inner via or one of the one or more intermediate vias, and the second via being one of the one or more intermediate vias or the outer via,
wherein a top width the first via is wider than a bottom width of the second via,
wherein a recess is formed in the first via to partially extend into a top surface thereof, and
wherein a bottom portion of the second via is within the recess, the bottom portion of the second via extending from a bottom surface thereof up to a height equal to a depth of the recess, the second via being in contact with the first via within the recess.

28. The method of claim 27,
wherein the top surface of the first via is drilled to form the recess, and
wherein the bottom portion of the second via fills the recess when the second via is being formed.

29. The method of claim 28, wherein the recess is formed by laser drilling the top surface of the first via.

30. The method of claim 27,
wherein the capture pad, the inner via, the inner dielectric layer, the one or more intermediate vias, the one or more intermediate dielectric layers, the outer via, the outer dielectric layer, and the cover pad are formed above an initial layer, wherein the method further comprises:
- forming a lower capture pad and a lower inner via in a lower inner dielectric layer stacked below the initial layer, the lower inner via being stacked below and electrically coupled with the lower capture pad;
- forming one or more lower intermediate vias in corresponding one or more lower intermediate dielectric layers stacked below the lower inner dielectric layer, the one or more lower intermediate vias being stacked below and electrically coupled with the lower inner via;
- forming a lower outer via in a lower outer dielectric layer stacked below the one or more lower intermediate dielectric layers, the lower outer via being stacked below and electrically coupled with the one or more lower intermediate vias; and
- forming a lower cover pad stacked below and electrically coupled with the lower outer via, wherein the stack layer structure comprises a first lower via and a second lower via stacked below the first lower via, the first lower via being the lower inner via or one of the one or more lower intermediate vias, and the second lower via being one of the one or more lower intermediate vias or the lower outer via, wherein a bottom width of the first lower via is wider than a top width of the second lower via, wherein a lower recess is formed in the first lower via to partially extend into a bottom surface thereof, and wherein a top portion of the second lower via is within the lower recess, the top portion of the second lower via extending from a top surface thereof down to a height equal to a depth of the lower recess, the second lower via being in contact with the first lower via within the lower recess.

* * * * *